US012727413B2

(12) United States Patent
Dahal et al.

(10) Patent No.: US 12,727,413 B2
(45) Date of Patent: Sep. 1, 2026

(54) METHODS FOR WET ATOMIC LAYER ETCHING OF TUNGSTEN USING HALOGENATION

(71) Applicant: Tokyo Electron Limited, Tokyo (JP)

(72) Inventors: Tulashi Dahal, Austin, TX (US); Kate Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 199 days.

(21) Appl. No.: 18/900,795

(22) Filed: Sep. 29, 2024

(65) Prior Publication Data

US 2025/0308929 A1 Oct. 2, 2025

Related U.S. Application Data

(63) Continuation-in-part of application No. 18/619,491, filed on Mar. 28, 2024, now Pat. No. 12,642,028.

(51) Int. Cl.
*H10P 50/66* (2026.01)
*C09K 13/00* (2006.01)

(52) U.S. Cl.
CPC ............ *H10P 50/667* (2026.01); *C09K 13/00* (2013.01)

(58) Field of Classification Search
None
See application file for complete search history.

(56) References Cited

U.S. PATENT DOCUMENTS 8,961,814 B2 2/2015 Van Duren et al.
9,365,770 B2 6/2016 Okabe et al.
9,768,327 B2 9/2017 Woehl et al.
10,096,487 B2 10/2018 Yang et al.
10,982,335 B2 4/2021 Abel
11,437,250 B2 * 9/2022 Abel ....................... C23C 22/77
11,802,342 B2 10/2023 Abel
2017/0053810 A1 2/2017 Yang et al.

(Continued)

FOREIGN PATENT DOCUMENTS

WO 2017099718 6/2017
WO 2023239495 12/2023

OTHER PUBLICATIONS

Notification of Transmittal of the International Search Report and the Written Opinion of the International Searching Authority, or the Declaration, International Filing Date Jun. 9, 2025, Application No. PCT/US2025/032911, Date of Mailing Sep. 29, 2025, 9 pgs.

(Continued)

*Primary Examiner* — Roberts P Culbert

(74) *Attorney, Agent, or Firm* — Egan, Enders & Huston LLP.

(57) ABSTRACT

Various embodiments of methods are provided for etching tungsten in a wet ALE process. The methods disclosed herein use a wide variety of wet etch chemistries to: (a) halogenate a tungsten surface and form a self-limiting, tungsten halide passivation layer in a surface modification step of the wet ALE process, and (b) selectively remove the tungsten halide passivation layer in a dissolution step of the wet ALE process. In the embodiments disclosed herein, a surface modification solution containing a halogenation agent dissolved in non-aqueous solvent is used to form a self-limiting, tungsten halide passivation layer, which is selectively removed in an aqueous dissolution solution via reactive dissolution/hydrolysis.

23 Claims, 13 Drawing Sheets

(56) References Cited

U.S. PATENT DOCUMENTS

| | | | |
|---|---|---|---|
| 2019/0198392 A1 | 6/2019 | Mullick et al. | |
| 2020/0286743 A1 | 9/2020 | Lai et al. | |
| 2020/0312673 A1* | 10/2020 | Tsai | H10P 50/267 |
| 2022/0139720 A1 | 5/2022 | Woods et al. | |
| 2022/0148885 A1 | 5/2022 | Abel et al. | |
| 2022/0199422 A1 | 6/2022 | Yang et al. | |
| 2023/0117790 A1 | 4/2023 | Abel | |
| 2023/0118554 A1 | 4/2023 | Abel | |
| 2023/0121246 A1 | 4/2023 | Abel | |
| 2023/0140900 A1 | 5/2023 | Netzband et al. | |
| 2023/0151495 A1 | 5/2023 | Greer et al. | |

OTHER PUBLICATIONS

Natarajan et al., "Mechanism of Thermal Atomic Layer Etch of W Metal Using Sequential Oxidation and Chlorination: A First-Principles Study", Applied Materials & Interfaces, ACS Appl. Mater. Interfaces, 2020, 11 pgs.

Fang et al., "Thermal Atomic Layer Etching: Mechanism, Materials and Prospects", ScienceDirect, National Laboratory of Solid State Microstructures, 2018, 9 pgs.

Xie et al., "Thermal Atomic Layer Etching of Metallic Tungsten via Oxidation and Etch Reaction Mechanism Using O2 or O3 for Oxidation and WCI6 as the Chlorinating Etchant", Journal of Vacuum Science Technology A, Obtained from Internet Feb. 2024, 40 pgs.

Xie et al., "Thermally Driven Self-Limiting Atomic Layer Etching of Metallic Tungsten Using WF6 and 02", Applied Materials & Interfaces, ACS Appl. Mater. Interfaces, 2018, 8 pgs.

Johnson et al., "WO3 and W Thermal Atomic Layer Etching Using "Conversion-Fluorination" and "Oxidation-Conversion-Flurorination" Mechanisms", Applied Materials & Interfaces, American Chemical Society, 2017, 13 pgs.

You et al., "Atomic Layer Etching of Tungsten Dlsulfide Using Remote Plasma-Induced Oxidation and Wet Etching", The Electrochemical Society J Solid State Sci. Technology, 2023, 7 pgs.

Dahal et al., Methods for Wet Atomic Layer Etching of Molybdenum, U.S. Appl. No. 18/240,142, filed Aug. 30, 2023, 72 pgs.

Dahal, "Methods for Wet Atomic Layer Etching of Molybdenum in Aqueous Solution", U.S. Appl. No. 18/636,818, filed Apr. 16, 2024, 62 pgs.

Dahal et al., "Methods for Wet Atomic Layer Etching of Tungsten", U.S. Appl. No. 18/619,491, filed Mar. 28, 2024, 67 pgs.

* cited by examiner

Figure 1:
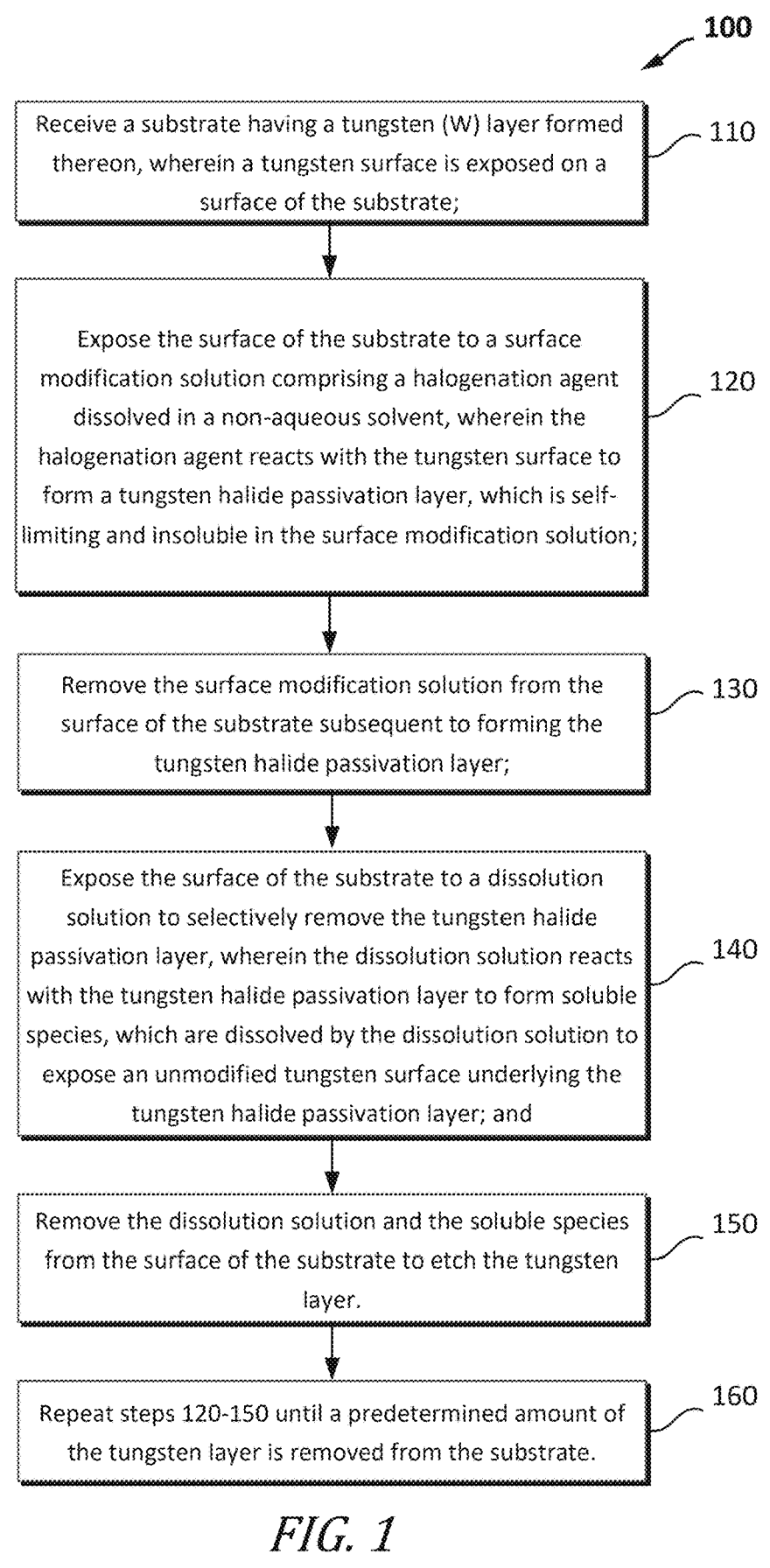

100

Receive a substrate having a tungsten (W) layer formed thereon, wherein a tungsten surface is exposed on a surface of the substrate; 110

Expose the surface of the substrate to a surface modification solution comprising a halogenation agent dissolved in a non-aqueous solvent, wherein the halogenation agent reacts with the tungsten surface to form a tungsten halide passivation layer, which is self-limiting and insoluble in the surface modification solution; 120

Remove the surface modification solution from the surface of the substrate subsequent to forming the tungsten halide passivation layer; 130

Expose the surface of the substrate to a dissolution solution to selectively remove the tungsten halide passivation layer, wherein the dissolution solution reacts with the tungsten halide passivation layer to form soluble species, which are dissolved by the dissolution solution to expose an unmodified tungsten surface underlying the tungsten halide passivation layer; and 140

Remove the dissolution solution and the soluble species from the surface of the substrate to etch the tungsten layer. 150

Repeat steps 120-150 until a predetermined amount of the tungsten layer is removed from the substrate. 160

Figure 10:
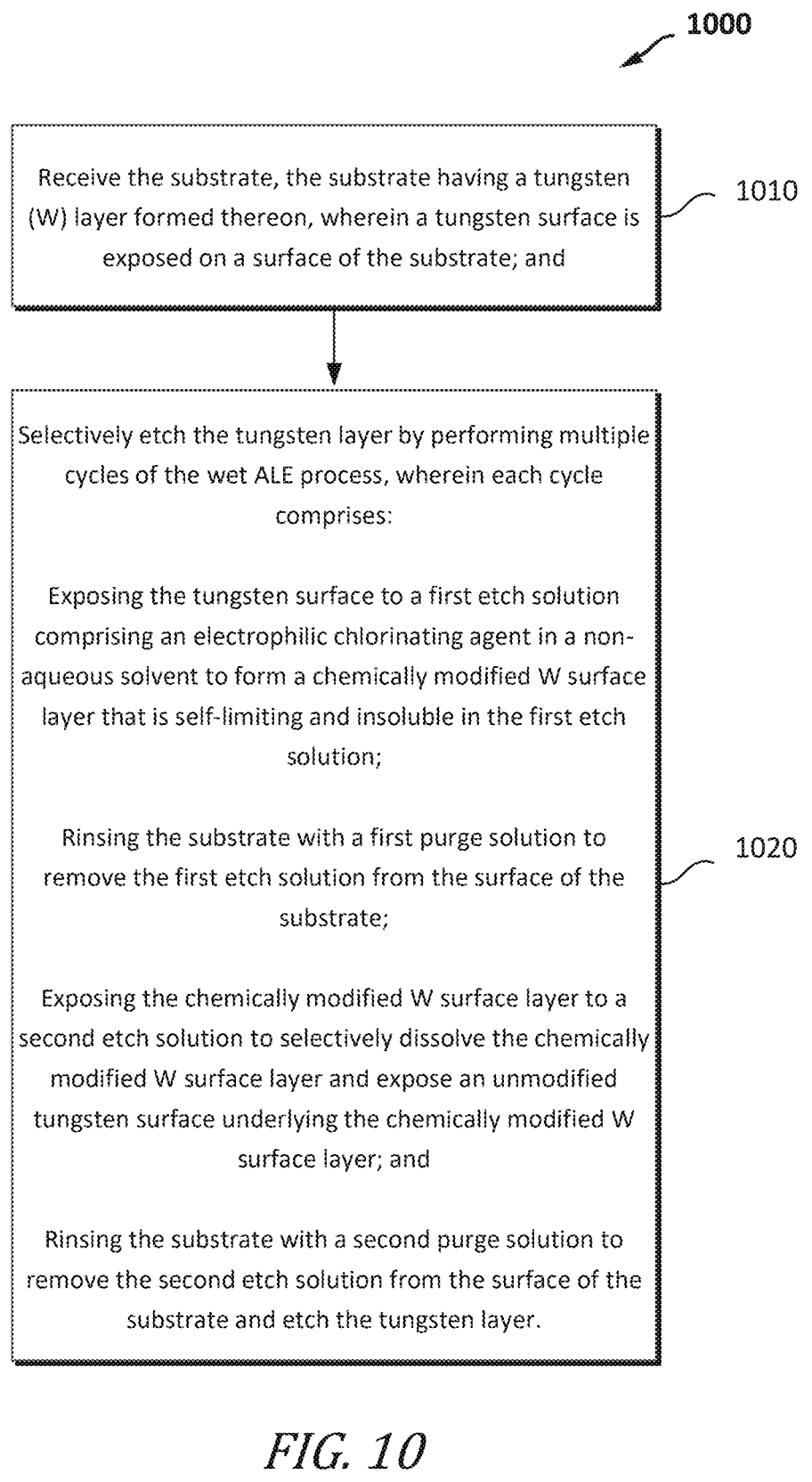

Receive the substrate, the substrate having a tungsten (W) layer formed thereon, wherein a tungsten surface is exposed on a surface of the substrate; and

1010

Selectively etch the tungsten layer by performing multiple cycles of the wet ALE process, wherein each cycle comprises:

Exposing the tungsten surface to a first etch solution comprising an electrophilic chlorinating agent in a non-aqueous solvent to form a chemically modified W surface layer that is self-limiting and insoluble in the first etch solution;

Rinsing the substrate with a first purge solution to remove the first etch solution from the surface of the substrate;

Exposing the chemically modified W surface layer to a second etch solution to selectively dissolve the chemically modified W surface layer and expose an unmodified tungsten surface underlying the chemically modified W surface layer; and Rinsing the substrate with a second purge solution to remove the second etch solution from the surface of the substrate and etch the tungsten layer.

METHODS FOR WET ATOMIC LAYER ETCHING OF TUNGSTEN USING HALOGENATION

RELATED APPLICATION

This application a continuation-in-part (CIP) of co-pending U.S. patent application Ser. No. 18/619,491, entitled "Methods for Wet Atomic Layer Etching of Tungsten," filed Mar. 28, 2024; the entirety of which is incorporated herein by reference.

BACKGROUND

This disclosure relates to semiconductor device manufacturing, and, in particular, to the removal and etching of polycrystalline materials, such as transition metals.

During routine semiconductor fabrication, various metals formed on a substrate may be removed by patterned etching, chemical-mechanical polishing, as well as other techniques. A variety of techniques are known for etching layers on a substrate, including plasma-based etching (otherwise referred to as dry etching) and liquid-based etching (otherwise referred to as wet etching). Wet etching generally involves dispensing a chemical solution over the surface of a substrate or immersing the substrate in the chemical solution. The chemical solution often contains a solvent, chemicals designed to react with materials on the substrate surface and chemicals to promote dissolution of the reaction products. As a result of exposure of the substrate surface to the etchant, material is removed from the substrate. Etchant composition and temperature may be controlled to control the etch rate, specificity and residual material on the surface of the substrate post-etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless of crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE is a process that removes thin layers sequentially through one or more self-limiting reactions. For example, ALE typically refers to techniques that can etch with atomic precision, i.e., by removing material one monolayer (or a few monolayers) of material at a time. ALE processes generally rely on a chemical modification of the surface to be etched followed by a selective removal of the modified layer. Thus, ALE processes offer improved performance by decoupling the etch process into sequential steps of surface modification and removal of the modified surface.

In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process leads to smoothing of the surface during etching rather than the roughening commonly seen during other etch processes.

A wet ALE process typically begins with a surface modification step, which exposes a material to a first solution to create a self-limiting modified surface layer. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

Tungsten (W) is widely used in integrated circuits as metal interconnects and diffusion barriers. Recently, controlled etch-back of tungsten has gained a growing interest for future device fabrications. Such applications require precise etch back of tungsten with improved, or at least preserved, post-etch surface morphology in the etched wafers. However, the polycrystalline nature of tungsten makes it susceptible to pitting if an etchant reacts at the grain boundaries with faster kinetics than the grain surface. Etchant chemistry should, at a minimum, leave the surface no rougher than it was initially, and ideally, improve the surface roughness during etching.

The post-etch surface roughness generally evolves with etch amount for many etchants traditionally used for etching tungsten. This leads to non-uniform material removal off the metal surface and results a rougher post-etch morphology. Accordingly, new wet etch chemistries are needed for etching tungsten.

SUMMARY

The present disclosure provides improved wet etch processes and methods for etching polycrystalline materials. More specifically, the present disclosure provides various embodiments of wet etch processes and methods that utilize new etch chemistries for etching transition metals, such as tungsten (W), in a wet etch process.

As described in more detail below, the embodiments disclosed herein expose a transition metal surface to a first etch solution to chemically modify the transition metal surface and form a modified surface layer (otherwise referred to herein as a passivation layer), which is selectively dissolved in a second etch solution to etch the transition metal surface. The first etch solution may include a halogenation agent dissolved in a non-aqueous solvent. The halogenation agent included within the first etch solution reacts with the transition metal surface to oxidize and halogenate the transition metal surface and form a transition metal halide passivation layer, which is self-limiting and insoluble in the non-aqueous solvent.

A wide variety of etch chemistries can be used for oxidizing and halogenating an exposed transition metal surface (such as, e.g., tungsten, W) and forming a self-limiting transition metal halide passivation layer on the underlying transition metal (e.g., metallic W). For example, the embodiments disclosed herein may use a chlorinating agent to form a tungsten chloride ($WCl_x$) or tungsten oxychloride ($WO_yCl_{(x-2y)}$) passivation layer on the underlying tungsten surface. Alternatively, a fluorinating agent or brominating agent may be used.

After forming a transition metal halide passivation layer, a second etch solution may be dispensed onto the surface of the substrate to selectively dissolve the transition metal halide passivation layer, thus removing the transition metal halide passivation layer from the substrate surface without etching the underlying transition metal (e.g., metallic W). Several etch chemistries can be used to selectively dissolve a tungsten halide passivation layer without dissolving metallic W or substantially increasing the post-etch surface roughness of the tungsten surface. In some embodiments, for example, the second etch solution may be an aqueous solution containing: (a) water, (b) a base (or an acid) dissolved in water, or (c) a ligand and a base (or an acid) dissolved in water. When aqueous solutions are used for dissolution, the tungsten halide passivation layer is selectively dissolved via hydrolysis to expose the metallic W underlying the tungsten oxide passivation layer. The ligand, base (or acid) included within the second etch solution increases the extent of hydrolysis during the dissolution step to increase the etch rate of the tungsten layer. In some embodiments, the ligand included within the second etch solution may prevent or inhibit oxidation of the unmodified tungsten surface (e.g., metallic W) once the tungsten oxide passivation layer is removed.

The embodiments disclosed herein preserve the post-etch surface roughness of the tungsten layer by forming a self-limiting tungsten halide passivation layer, which is selectively removed via hydrolysis in the dissolution step. Both the surface modification and the dissolution steps may be self-limiting in nature. In some embodiments, the concentration of the halogenation agent used in the first etch solution and the concentration of the base (or acid) used in the second etch solution may be limited to preserve the post-etch surface roughness of the tungsten layer and provide a more sustainable process with minimal environmental impact. In some embodiments, a base, acid or ligand may be added to the second etch solution, or the dissolution temperature may be elevated, to increase the extent of hydrolysis and the etch rate of the tungsten layer. The ligand added to the second etch solution is preferably a reducing agent that prevents (or at least inhibits) parasitic oxidation of the unmodified tungsten surface after the tungsten halide passivation layer is hydrolyzed and removed by the second etch solution. However, a ligand may not be strictly needed in the second etch solution if small amounts of halogenated material are left on the surface after the dissolution step, as such material may prevent (or inhibit) parasitic oxidation similar to ligands.

According to one embodiment, a method is provided herein for etching a substrate having a tungsten layer formed thereon. In some embodiments, the method may begin by receiving a substrate having a tungsten (W) layer formed thereon, where a tungsten surface is exposed on a surface of the substrate, and exposing the surface of the substrate to a surface modification solution comprising a halogenation agent dissolved in a non-aqueous solvent. The halogenation agent reacts with the tungsten surface to form a tungsten halide passivation layer, which is self-limiting and insoluble in the surface modification solution. The method further includes removing the surface modification solution from the surface of the substrate subsequent to forming the tungsten halide passivation layer, and exposing the surface of the substrate to a dissolution solution to selectively remove the tungsten halide passivation layer. The dissolution solution reacts with the tungsten halide passivation layer to form soluble species, which are dissolved by the dissolution solution to expose an unmodified tungsten surface underlying the tungsten halide passivation layer. The method further includes removing the dissolution solution and the soluble species from the surface of the substrate to etch the tungsten layer. In some embodiments, the steps of exposing the surface of the substrate to the surface modification solution, removing the surface modification solution, exposing the surface of the substrate to the dissolution solution, and removing the dissolution solution and the soluble species may be repeated a number of times until a predetermined amount of the tungsten layer is removed from the substrate.

A wide variety of halogenation agents and non-aqueous solvents may be used in the surface modification solution to form the tungsten halide passivation layer. For example, the halogenation agent may be a chlorinating agent, a fluorinating agent or a brominating agent. Examples of chlorinating agents that may be included within the surface modification solution include, but are not limited to, trichloroisocyanuric acid (TCCA), oxalyl chloride, N-chlorosuccinimide, 1-chlorobenzotriazole, Chloramine-T and tert-butyl-N-chlorocyanamide. Examples of fluorinating agents include, but are not limited to, 1-chloromethyl-4-fluoro-1,4-diazoniabicyclo [2.2.2]octane bis(tetrafluoroborate), 1-fluoropyridinium triflate, 1-fluoro-2,4,6-trimethylpyridinium tetrafluoroborate, N-fluorobenzenesulfonimide, fluoroxytrifluoromethane, perchloryl fluoride, xenon difluoride and N-fluorobis[(trifluoromethyl)sulfonyl]imide. Examples of brominating agents include, but are not limited to, N-bromosuccinimide, dibromoisocyanuric acid, tribromocyanuric acid, 1,3-Dibromo-5,5-Dimethylhydantoin and N-Bromoacetamide. The non-aqueous solvent may be an ether, a ketone, a halocarbon, a heterocyclic, an alcohol or another polar organic solvent. For example, the non-aqueous solvent may be ethyl acetate, acetone, acetonitrile, dimethyl sulfoxide, furan, dimethylformamide, methanol, diethyl ether, isopropyl alcohol or dioxane.

In some embodiments, the surface modification solution may be a non-aqueous solution comprising an electrophilic chlorinating agent dissolved in non-aqueous solvent. The chlorinating agents listed above are all examples of electrophilic chlorinating agents, with the exception of oxalyl chloride (which is not electrophilic). In one example, the surface modification solution may comprise trichloroisocyanuric acid (TCCA) dissolved in a polar organic solvent, such as ethyl acetate or acetone. When an electrophilic chlorinating agent is used, the electrophilic chlorinating agent may react with the tungsten surface to form a tungsten chloride or tungsten oxychloride passivation layer, which is self-limiting and insoluble in the surface modification solution.

In some embodiments, the concentration of the electrophilic chlorinating agent may be selected to avoid substantially increasing the post-etch surface roughness of the tungsten layer compared to the initial surface roughness of the tungsten layer before etching. When TCCA is used, the concentration of TCCA used in the surface modification solution may range between 0.05% and 0.5% to preserve the post-etch surface roughness of the tungsten layer. In one example embodiment, the surface modification solution may comprise 0.1% TCCA dissolved in ethyl acetate or acetone.

The dissolution solution may be an aqueous solution. For example, the dissolution solution may contain: (a) water, (b) a base (or an acid) dissolved in water, or (c) a ligand and a base (or an acid) dissolved in water. The water within the dissolution solution hydrolyzes the tungsten chloride or tungsten oxychloride passivation layer to form soluble species, which are selectively dissolved by the dissolution solution to expose the unmodified tungsten surface underlying the tungsten chloride or tungsten oxychloride passivation layer. In some embodiments, the dissolution temperature may be elevated above room temperature to increase the rate of dissolution and the etch rate of the tungsten layer. For example, the surface of the substrate may be exposed to the dissolution solution at an elevated temperature ranging between 25° C. and 75° C. to increase a dissolution rate of the tungsten chloride or tungsten oxychloride passivation layer, which in turn, may increase the etch rate of the tungsten layer. In other embodiments, a base (or an acid) may be added to the dissolution solution to increase the dissolution rate of the tungsten chloride or tungsten oxychloride passivation layer and the etch rate of the tungsten layer.

A wide variety of chemical species may be added to the dissolution solution to increase the dissolution rate. In some embodiments, a base such as, but not limited to, ammonium hydroxide ($NH_4OH$), tetramethylammonium hydroxide (TMAH), potassium hydroxide (KOH) and calcium hydroxide ($Ca(OH)_2$), may be added to the dissolution solution to increase the dissolution rate. In other embodiments, an acid may be added to the dissolution solution to increase the dissolution rate. Examples of acids that may be included within the dissolution solution include, but are not limited to, hydrochloric acid (HCl), nitric acid or sulfuric acid.

In some embodiments, a ligand may be added to the dissolution solution to increase the dissolution rate. In other embodiments, the ligand added to the dissolution may prevent or at least inhibit parasitic oxidation of the unmodified tungsten surface after the passivation layer is removed. In doing so, the ligand may prevent continuous etching of the tungsten layer during the dissolution step.

In some embodiments, the ligand added to the dissolution solution may contain an ascorbate anion. For example, the ligand may be ascorbic acid, sodium ascorbate, calcium ascorbate or potassium ascorbate. However, other ligands can be used to prevent continuous etching of the tungsten layer during the dissolution step. For example, carboxylic acids (such as, e.g., oxalic acid, formic acid, acetic acid, etc.), amine-containing ligands (such as, e.g., ethylenediamine, ethylenediaminetetraacetic acid (EDTA), iminodiacetic acid, etc.), or other molecules that bind to the metal surface through N, P, O, or S heteroatoms can be used as a ligand. Although several different types of ligands may be used, ligands containing ascorbate anions (such as, e.g., ascorbic acid) may enable higher etch rates than ligands containing other anions (such as, e.g., formate anions, oxalate anions, etc.), and thus, may be preferred in some embodiments.

In one embodiment, an aqueous basic solution comprising a ligand and a base may be used in the dissolution solution to selectively remove the tungsten chloride or tungsten oxychloride passivation layer. The water selectively dissolves the tungsten chloride or tungsten oxychloride passivation layer (via reactive dissolution/hydrolysis) to expose the unmodified tungsten surface underlying the passivation layer. The base increases the rate of dissolution of the tungsten chloride or tungsten oxychloride passivation layer, and the ligand prevents (or at least inhibits) parasitic oxidation of the unmodified tungsten surface after the tungsten chloride or tungsten oxychloride passivation layer is removed. In some embodiments, the dissolution solution may be an aqueous basic solution comprising 0 mM to 10 mM ascorbic acid dissolved in 0.05 mM to 1 M of ammonium hydroxide ($NH_4OH$) and water. In one example implementation, 10 mM of ascorbic acid dissolved in 5 mM of $NH_4OH$ results in self-limiting dissolution; however, other concentrations of ascorbic acid and $NH_4OH$ may also be used.

According to another embodiment, a method is provided herein for etching a substrate using a wet atomic layer etching (ALE) process. In some embodiments, the method may begin by receiving the substrate, the substrate having a tungsten (W) layer formed thereon, wherein a tungsten surface is exposed on a surface of the substrate. The method further includes selectively etching the tungsten layer by performing multiple cycles of the wet ALE process, wherein each cycle comprises: (a) exposing the tungsten surface to a first etch solution comprising an electrophilic chlorinating agent in a non-aqueous solvent to form a chemically modified W surface layer that is self-limiting and insoluble in the non-aqueous solvent; (b) rinsing the substrate with a first purge solution to remove the first etch solution from the surface of the substrate; (c) exposing the chemically modified W surface layer to a second etch solution to selectively dissolve the chemically modified W surface layer expose an unmodified tungsten surface underlying the chemically modified W surface layer; and (d) rinsing the substrate with a second purge solution to remove the second etch solution from the surface of the substrate and etch the tungsten layer.

A wide variety of electrophilic chlorinating agents and non-aqueous solvents may be used in the first etch solution to form the chemically modified W surface layer. In one embodiment, the first etch solution may include trichloroisocyanuric acid (TCCA) dissolved in a polar organic solvent, such as ethyl acetate or acetone. However, other electrophilic chlorinating agents and non-aqueous solvents may be used in the first etch solution, as discussed above. When an electrophilic chlorinating agent is used within the first etch solution, the electrophilic chlorinating agent may react with the tungsten surface to form a tungsten chloride or tungsten oxychloride passivation layer, which is self-limiting and insoluble in the non-aqueous solvent.

In some embodiments, the concentration of the electrophilic chlorinating agent used in the first etch solution may be selected to avoid substantially increasing the post-etch surface roughness of the tungsten layer compared to the initial surface roughness of the tungsten layer before etching. When TCCA is used, a concentration of TCCA in the surface modification solution may range between 0.05% and 0.5% to preserve the post-etch surface roughness of the tungsten layer. In one example embodiment, the surface modification solution may comprise 0.1% TCCA dissolved in ethyl acetate or acetone.

In some embodiments, an aqueous solution comprising a base dissolved in water may be used in the second etch solution to selectively dissolve the chemically modified W surface layer (such as, e.g., a tungsten chloride or tungsten oxychloride passivation layer). The water may react with (e.g., hydrolyze) the chemically modified W surface layer to selectively dissolve the chemically modified W surface layer and expose the unmodified tungsten surface underlying the chemically modified W surface layer. The base may increase an etch rate of the tungsten layer by increasing a dissolution rate of the chemically modified W surface layer. In some embodiments, the dissolution solution may further include a ligand, which prevents or at least inhibits oxidation of the unmodified tungsten surface after the chemically modified W surface layer is removed.

A wide variety of ligands and bases may be used in the second etch solution to selectively dissolve the chemically modified W surface layer without increasing the post-etch surface roughness of the tungsten layer. For example, the base may be ammonium hydroxide ($NH_4OH$), tetramethylammonium hydroxide (TMAH), potassium hydroxide (KOH) or calcium hydroxide ($Ca(OH)_2$). Examples of ligands that may be added to the base include, but are not limited to, ascorbic acid, sodium ascorbate, calcium ascorbate, potassium ascorbate, oxalic acid, formic acid, acetic acid, ethylenediamine, ethylenediaminetetraacetic acid (EDTA), and iminodiacetic acid. In one example implementation, the dissolution solution may be an aqueous basic solution comprising 0 mM to 10 mM ascorbic acid dissolved in 0.05 mM to 1 M of ammonium hydroxide ($NH_4OH$) and water.

As noted above and described further herein, the present disclosure provides various embodiments of methods that utilize new etch chemistries for etching a transition metal layer in a wet etch process. Specifically, methods and new etch chemistries are provided herein for etching tungsten (W) in a wet ALE process. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary Section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 1 is a flowchart diagram illustrating one embodiment of a method that utilizes the techniques disclosed herein for etching a substrate having a tungsten surface exposed on a surface of the substrate.

FIG. 10 is a flowchart diagram illustrating one embodiment of a method that utilizes the techniques disclosed herein for etching a substrate having a tungsten surface exposed on a surface of the substrate using a cyclic wet atomic layer etching (ALE) process.

DETAILED DESCRIPTION

Figure 2:
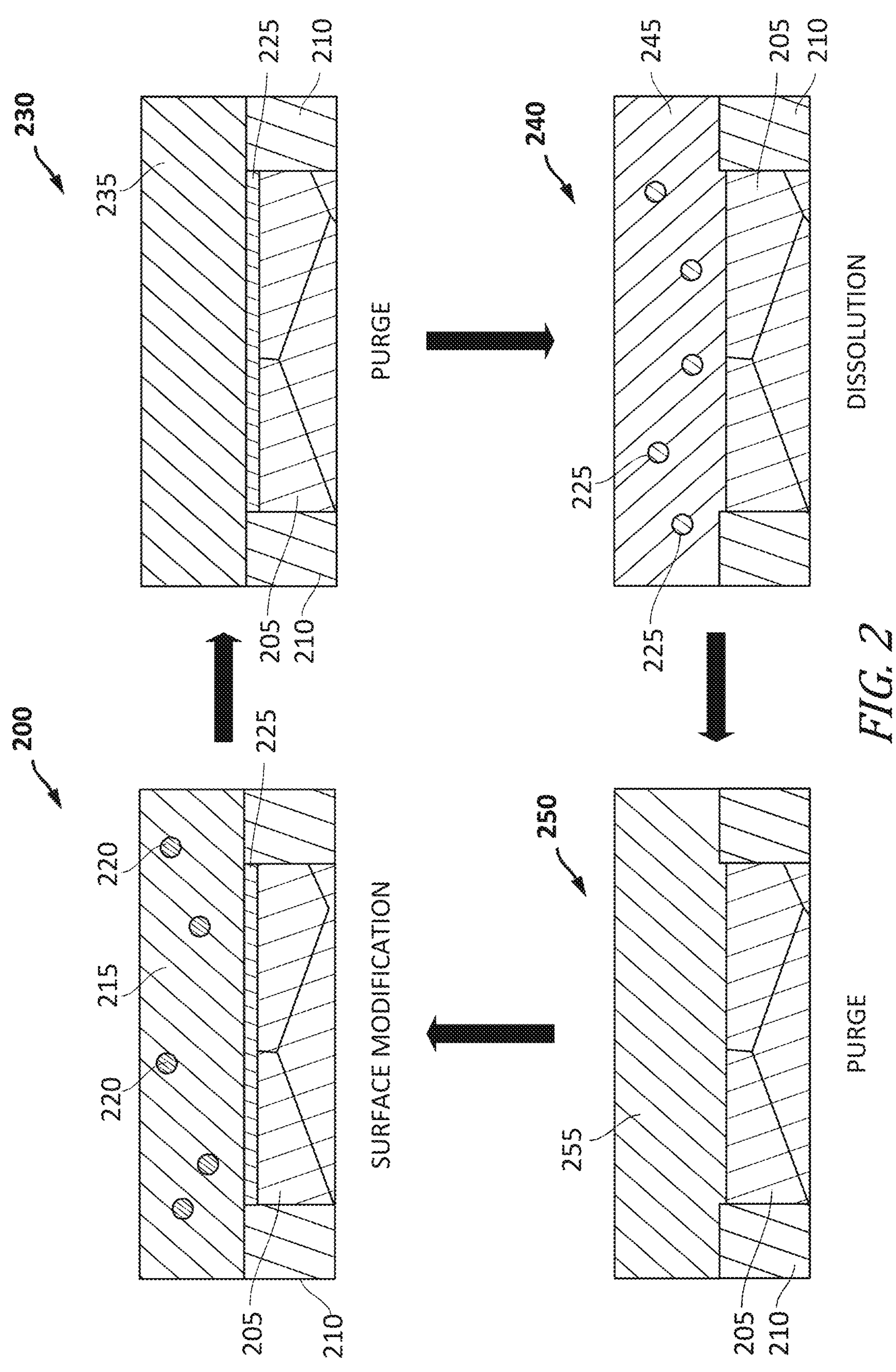
FIG. 2 illustrates one example of a cyclic wet ALE process that can be used to etch a transition metal surface, such as a tungsten surface, in accordance with a first embodiment of the present disclosure.

Wet atomic layer etching (ALE) processes can be used to etch transition metals formed on a substrate by performing one or more cycles of the wet ALE process, where each cycle includes a surface modification step and a dissolution step. In the surface modification step, an exposed surface of the transition metal may be exposed to a surface modification solution containing a halogenation agent to chemically modify the exposed surface of the transition metal and form a modified surface layer (e.g., a transition metal halide passivation layer). In the dissolution step, the modified surface layer is selectively removed by exposing the modified surface layer to a dissolution solution to dissolve the modified surface layer. Purge steps are performed between the surface modification and dissolution steps to prevent the surface modification and dissolution solutions from mixing, and the process may be repeated in a cyclic manner until a desired amount of etching is achieved. In order to achieve atomic layer etching, however, at least one of the surface modification and dissolutions steps must be self-limiting.

A variety of transition metals may be etched using wet ALE processes, including cobalt (Co), ruthenium (Ru), copper (Cu), gold (Au), platinum (Pt), Iridium (Ir), molybdenum (Mo), tungsten (W), etc. Wet ALE processes for etching such transition metals are disclosed in U.S. Pat. No. 10,982,335, entitled "Wet Atomic Layer Etching Using Self-Limiting and Solubility-limited Reactions," U.S. Pat. No. 11,802,342, entitled "Methods for Wet Atomic Layer Etching of Ruthenium," U.S. Pat. No. 11,866,831, entitled "Methods for Wet Atomic Layer Etching of Copper," US Patent Application Publication No. 2023/0121246, entitled "Methods for Wet Atomic Layer Etching of Noble Metals," U.S. patent application Ser. No. 18/240,142, entitled "Methods for Wet Atomic Layer Etching of Molybdenum," U.S. patent application Ser. No. 18/619,491, entitled "Methods for Wet Atomic Layer Etching of Tungsten," and U.S. patent application Ser. No. 18/636,818, entitled "Methods for Wet Atomic Layer Etching of Molybdenum in Aqueous Solution," each of which is incorporated herein by reference.

Tungsten (W) is a transition metal commonly used in semiconductor manufacturing. However, developing wet ALE chemistries for etching tungsten is difficult because many surface reactions do not lead to self-limiting behavior. For example, although a variety of oxidation techniques can be used to form a quasi-self-limiting or strictly self-limiting tungsten oxide passivation layer (such as, e.g., $WO_3$), selective dissolution of the tungsten oxide passivation layer is challenging when using strong bases (such as, e.g., potassium hydroxide, KOH, sodium hydroxide, NaOH, or calcium hydroxide, $Ca(OH)_2$) or strong acids (such as, e.g., hydrochloric acid, HCl, nitric acid, $HNO_3$, or sulfuric acid, $H_2SO_4$) to remove the tungsten oxide passivation layer. Strong bases and acids cause preferential grain boundaries attack, leading to a continuous etch of the tungsten surface and increasing post-etch surface roughness of the tungsten surface. To mitigate these challenges, new wet ALE chemistries and techniques are needed for etching tungsten and other transition metals.

The present disclosure provides a new wet atomic layer etch (ALE) process for etching a transition metal formed on a substrate. More specifically, the present disclosure provides various embodiments of methods that utilize new etch chemistries for etching tungsten (W) in a wet ALE process. As described in more detail below, the wet ALE processes and methods disclosed herein may use a wide variety of halogenation agents to halogenate and oxidize a tungsten surface exposed on a substrate and form a self-limiting, tungsten halide passivation layer (such as, e.g., a tungsten chloride or oxychloride passivation layer) on the underlying tungsten surface (e.g., metallic W) in a surface modification step of the wet ALE process. The tungsten halide passivation layer is then selectively removed in a dissolution step of the wet ALE process to etch the tungsten surface. In the wet ALE processes and methods disclosed herein, a concentration of the halogenation agent is limited to avoid substantially increasing the post-etch surface roughness of the tungsten surface.

Unlike conventional methods for etching tungsten, the methods disclosed herein utilize new etch chemistries for etching tungsten in a wet ALE process that provides self-limiting behavior in the surface modification and dissolution steps. As used herein, a "self-limiting" behavior, or "self-limiting" reaction, is one in which the reaction rate goes to zero over time. In comparison to a strictly self-limiting reaction, a "quasi-limiting" reaction is one in which the reaction rate decreases over time but does not go to zero. In the wet ALE processes and methods disclosed herein, self-limiting behavior is provided in the surface modification step by using a halogenating agent (such as, e.g., TCCA) in non-aqueous solvent to form a tungsten halide passivation layer that is insoluble in the non-aqueous solvent. In addition to self-limiting surface modification, the wet ALE processes and methods disclosed herein provide self-limiting behavior in the dissolution step, which uses reactive dissolution/hydrolysis to selectively remove the tungsten halide passivation layer.

The techniques disclosed herein may be performed on a wide variety of substrates having a wide variety of layers and features formed thereon. In general, the substrates utilized with the techniques disclosed herein may be any substrates for which the etching of material is desirable. For example, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

The techniques disclosed herein may be used to etch a wide variety of materials, including polycrystalline materials, single-crystalline materials and amorphous materials. In some embodiments, the techniques described herein may be used to etch a metal material such as, but not limited to, transition metals and noble metals. In one exemplary embodiment, the material to be etched may be tungsten (W). Although the techniques described herein are discussed below in reference to etching tungsten, it will be recognized by those skilled in the art that such an example is merely exemplary and the techniques described herein may be used to etch other transition metals such as, for example, copper (Cu) and molybdenum (Mo). However, the etch chemistries disclosed herein may not be sufficient to etch other transition metals such as, for example, tantalum (Ta), ruthenium (Ru), cobalt (Co), platinum (Pt) and nickel (Ni). Thus, the etch chemistries and methods disclosed herein for etching tungsten (W) may provide good etch selectivity to such materials.

The techniques disclosed herein offer multiple advantages over other etch techniques used for etching transition metals. For example, the techniques disclosed herein provide the benefits of ALE, such as precise control of total etch amount, control of surface roughness, and improvements in wafer-scale uniformity. The techniques disclosed herein also provide various benefits of wet etching, such as the simplicity of the etch chamber, self-limiting reactions at near atmospheric temperature and pressure etching conditions, and reduced surface roughness. Unlike conventional etch processes used to etch transition metals, such as tungsten, the techniques disclosed herein provide a wet ALE process that provides a self-limiting surface modification step and a selective dissolution step for etching the transition metal. As such, the techniques described herein provide unique methods for etching tungsten.

FIG. 1 illustrates one embodiment of a method 100 that can be used to etch a substrate using a wet atomic layer etching (ALE) process. More specifically, FIG. 1 illustrates an embodiment of a method 100 that can be used to etch a tungsten (W) layer formed on a substrate using a wet ALE process. It will be recognized that the embodiment of FIG. 1 is merely exemplary and additional methods may utilize the wet ALE techniques described herein. Further, additional processing steps may be added to the method shown in the FIG. 1 as the steps described are not intended to be exclusive. Moreover, the order of the steps is not limited to the order shown in the figures as different orders may occur and/or various steps may be performed in combination or at the same time.

The method 100 shown in FIG. 1 includes receiving a substrate having a tungsten (W) layer formed thereon, wherein a tungsten surface is exposed on a surface of the substrate (in step 110), and exposing the surface of the substrate to a surface modification solution comprising a halogenation agent dissolved in a non-aqueous solvent (in step 120). The halogenation agent included within the surface modification solution reacts with the tungsten surface to form a tungsten halide passivation layer, which is self-limiting and insoluble in the surface modification solution. A wide variety of halogenation agents may be included within the surface modification solution, as described in more detail below.

After forming the self-limiting tungsten halide passivation layer, method 100 removes the surface modification solution from the surface of the substrate (in step 130), and exposes the surface of the substrate to a dissolution solution to selectively remove the tungsten halide passivation layer (in step 140). The dissolution solution reacts with the tungsten halide passivation layer to form soluble species, which are dissolved by the dissolution solution to expose an unmodified tungsten surface underlying the tungsten halide passivation layer. The method 100 removes the dissolution solution and the soluble species from the surface of the substrate to etch the tungsten layer (in step 150). In some embodiments, the method may repeat steps 120-150 a number of times (in step 160) until a predetermined amount of the tungsten is removed from the substrate.

The method 100 shown in FIG. 1 can be used to etch tungsten (and other transition metals) in a wet ALE process by performing multiple cycles of the wet ALE process, wherein each cycle includes a surface modification step (step 120) to oxidize and halogenate the tungsten surface and form a tungsten halide passivation layer, and a dissolution step (step 140) to selectively remove the tungsten halide passivation layer without removing the unmodified tungsten surface underlying the tungsten halide passivation layer. Purge steps (steps 130 and 150) are performed between the surface modification and dissolution steps to prevent the surface modification and dissolution solutions from mixing, and the process may be repeated in a cyclic manner until a desired amount of etching is achieved. Example etch chemistries that may be used in the surface modification step (step 120), the dissolution step (step 140) and the purge steps (steps 130 and 150) are described in more detail below.

FIG. 2 illustrates one example of a wet ALE process that can be used to etch tungsten (and other transition metals) in accordance with a first embodiment of the present disclosure. As described in more detail below, the wet ALE process shown in FIG. 2 is a cyclical process consisting of one or more ALE cycles, where each ALE cycle includes a surface modification step 200, a first purge step 230, a dissolution step 240 and a second purge step 250.

In the wet ALE process shown in FIG. 2, a tungsten layer 205 surrounded by a dielectric material 210 is brought in contact with a surface modification solution 215 during the surface modification step 200. The surface modification solution 215 is a non-aqueous solution containing a halogenation agent 220 dissolved in non-aqueous solvent. The halogenation agent 220 reacts with an exposed surface of the tungsten layer 205 to oxidize and halogenate the tungsten surface and form a tungsten halide passivation layer 225, which is self-limiting and insoluble in the non-aqueous solvent. A wide variety of halogenation agents 220 and non-aqueous solvents may be used in the surface modification solution 215. For example, the halogenation agent 220 may be a chlorinating agent, a fluorinating agent, or a brominating agent. The non-aqueous solvent may be an ether, a ketone, a halocarbon, a heterocyclic, an alcohol or another polar organic solvent. In one example embodiment, the surface modification solution 215 may contain trichloroisocyanuric acid (TCCA) dissolved in ethyl acetate or acetone. However, other halogenation agents and non-aqueous solvents may also be used in the surface modification solution 215, as described in more detail below.

After the tungsten halide passivation layer 225 is formed in the surface modification step 200, the first purge step 230 is performed to remove the surface modification solution 215 from the surface of the substrate. In the first purge step 230, the substrate is rinsed with a first purge solution 235 to remove the surface modification solution 215 and excess reactants from the surface of the substrate. The first purge solution 235 should not react with the tungsten halide passivation layer 225 formed during the surface modification step 200, or with the reactants in the surface modification solution 215. In some embodiments, the first purge solution 235 may use the same solvent (e.g., ethyl acetate or acetone) used in the surface modification solution 215. However, other solvents (such as deionized water) may also be utilized, as discussed in more detail below. In some embodiments, the first purge step 230 may be long enough to completely remove all excess reactants from the substrate surface.

After the substrate is rinsed, the dissolution step 240 is performed to selectively remove the tungsten halide passivation layer 225 formed during the surface modification step 200. In the dissolution step 240, the substrate is exposed to a dissolution solution 245 to selectively remove or dissolve the tungsten halide passivation layer 225 without removing the unmodified tungsten layer 205 underlying the tungsten halide passivation layer 225 or the dielectric material 210 surrounding the tungsten layer 205.

The dissolution solution 245 is an aqueous solution containing: (a) water, (b) a base (or an acid) dissolved in water, or (c) a ligand and a base (or an acid) dissolved in water. When the tungsten halide passivation layer 225 is exposed to the dissolution solution 245, the water within the dissolution solution 245 reacts with (e.g., hydrolyzes) the tungsten halide passivation layer 225 to form the soluble species, which are dissolved by the dissolution solution 245 to expose the unmodified tungsten layer 205 underlying the tungsten halide passivation layer 225. The base (or the acid) included within the dissolution solution 245 increases the dissolution rate of the tungsten halide passivation layer 225. Examples of bases that may be included within the dissolution solution 245 include, but are not limited to, ammonium hydroxide ($NH_4OH$), tetramethylammonium hydroxide (TMAH), potassium hydroxide (KOH), sodium hydroxide (NaOH) and calcium hydroxide ($Ca(OH)_2$). Examples of acids include, but are not limited to, hydrochloric acid (HCl), nitric acid ($HNO_3$) and sulfuric acid ($H_2SO_4$).

In some embodiments, a ligand (not shown in FIG. 2) may be added to the dissolution solution 245 to prevent (or at least inhibit) oxidative damage on the exposed tungsten surface. The ligand added to the dissolution solution 245 may be a ligand and/or reducing agent, which inhibits oxidation of the unmodified tungsten layer 205. A wide variety of ligands and reducing agents may be used in the dissolution solution 245 such as, but not limited to, ascorbic acid, sodium ascorbate, calcium ascorbate or potassium ascorbate, oxalic acid, formic acid, acetic acid, ethylenediamine, ethylenediaminetetraacetic acid (EDTA) and iminodiacetic acid. Other acids, bases and ligands may also be utilized within the dissolution solution 245, as discussed in more detail below.

In order to selectively remove the tungsten halide passivation layer 225, the tungsten halide passivation layer 225 must be soluble, and the unmodified tungsten layer 205 underlying the tungsten halide passivation layer 225 must be insoluble, in the dissolution solution 245. The solubility of the tungsten halide passivation layer 225 allows its removal through dissolution into the bulk dissolution solution 245. In some embodiments, the dissolution step 240 may continue until the tungsten halide passivation layer 225 is dissolved.

Once the tungsten halide passivation layer 225 is dissolved within the dissolution solution 245, the wet ALE etch cycle shown in FIG. 2 may be completed by performing a second purge step 250 to remove the dissolution solution 245 from the surface of the substrate. In the second purge step 250, the substrate is rinsed with a second purge solution 255, which may be the same or different than the first purge solution 235. In some embodiments, the second purge solution 255 may use the same solvent (e.g., ethyl acetate or acetone) used within the surface modification solution 215. However, other solvents may also be utilized, as discussed in more detail below. The second purge step 250 may generally continue until the dissolution solution 245 and/or the reactants and soluble species contained with the dissolution solution 245 are completely removed from the surface of the substrate.

Wet ALE of tungsten requires the formation of a self-limiting passivation layer on the underlying unmodified tungsten layer. This passivation layer must be insoluble in the first etch solution used for its formation (i.e., surface modification solution 215), but freely soluble in a second etch solution (i.e., dissolution solution 245) used for its dissolution. The self-limiting passivation layer must be removed every cycle after its formation. The second etch solution is used to selectively dissolve the passivation layer without etching the underlying unmodified tungsten layer.

The wet ALE process shown in FIG. 2 may utilize a wide variety of etch chemistries to oxidize and halogenate the tungsten surface and form a self-limiting, tungsten halide passivation layer in the surface modification step 200. For example, the halogenation agent 220 used in the wet ALE process may be a chlorinating agent, a fluorinating agent or a brominating agent. Examples of chlorinating agents that may be included within the surface modification solution 215 include, but are not limited to, trichloroisocyanuric acid (TCCA), oxalyl chloride, N-chlorosuccinimide, 1-chlorobenzotriazole, Chloramine-T and tert-butyl-N-chlorocyanamide. Examples of fluorinating agents that may be included within the surface modification solution 215 include, but are not limited to, 1-chloromethyl-4-fluoro-1,4-diazoniabicyclo[2.2.2]octane bis(tetrafluoroborate) (tradename Selectfluor™), 1-fluoropyridinium triflate, 1-fluoro-2,4,6-trimethylpyridinium tetrafluoroborate, N-fluorobenzenesulfonimide, fluoroxytrifluoromethane, perchloryl fluoride, xenon difluoride and N-fluorobis[(trifluoromethyl)sulfonyl]imide. Examples of brominating agents that may be included within the surface modification solution 215 include, but are not limited to, N-bromosuccinimide, dibromoisocyanuric acid, tribromocyanuric acid, 1,3-Dibromo-5,5-Dimethylhydantoin and N-Bromoacetamide. In some embodiments, the halogenation agent 220 may be dissolved in a non-aqueous solvent such as an ether, a ketone, a halocarbon, a heterocyclic, an alcohol or another polar organic solvent. Examples of non-aqueous solvents include, but are not limited to, ethyl acetate ($C_4H_8O_2$), acetone ($C_3H_6O$), acetonitrile ($C_2H_3N$), dimethyl sulfoxide ($C_2H_6OS$), furan ($C_4H_4O$), dimethylformamide ($C_3H_7NO$), methanol ($CH_3OH$), diethyl ether ($(C_2H_5)_2O$), isopropyl alcohol (IPA, $C_3H_8O$), dioxane ($C_4H_8O_2$) and toluene ($C_6H_5CH_3$).

In some embodiments, the surface modification solution 215 may be a non-aqueous solution comprising an electrophilic chlorinating agent dissolved in non-aqueous solvent. The chlorinating agents listed above are all examples of electrophilic chlorinating agents, with the exception of oxalyl chloride (which is not electrophilic). In one example, the surface modification solution 215 may comprise trichloroisocyanuric acid (TCCA) dissolved in ethyl acetate ($C_4H_8O_2$) or acetone ($C_3H_6O$). When an electrophilic chlorinating agent is used, the electrophilic chlorinating agent may react with the tungsten surface to form a tungsten chloride (e.g., $WCl_x$) or tungsten oxychloride (e.g., $WO_yCl_{(x-2y)}$) passivation layer, which is self-limiting and insoluble in the non-aqueous solvent used in the surface modification solution 215.

After forming a self-limiting tungsten halide passivation layer 225 using one of the halogenating chemistries disclosed above, the wet ALE process shown in FIG. 2 may utilize a wide variety of etch chemistries to selectively remove the tungsten halide passivation layer 225 in the dissolution step 240 without etching the unmodified tungsten layer 205 (e.g., metallic W) underlying the tungsten halide passivation layer 225. For example, the wet ALE process may use an aqueous solution in the dissolution step 240 to selectively remove the tungsten halide passivation layer 225 via reactive dissolution/hydrolysis.

In some embodiments, the dissolution solution 245 may be deionized water. When the tungsten halide passivation layer 225 is exposed to deionized water in the dissolution step 240, the deionized water reacts with (e.g., hydrolyzes) the tungsten halide passivation layer 225 to form soluble species, which are dissolved in the deionized water. In some embodiments, a base (or an acid) may be added to the dissolution solution 245 to increase the rate of hydrolysis, and thus, the dissolution rate of the tungsten halide passivation layer 225. A ligand may also be added to the dissolution solution 245, in some embodiments. For example, a ligand may be added to the dissolution solution 245 to inhibit oxidation of the unmodified tungsten layer 205 after the tungsten halide passivation layer 225 is removed.

In some embodiments, the dissolution solution 245 may be an aqueous solution containing a ligand and a base. Examples of bases that may be included within the dissolution solution 245 include, but are not limited to, ammonium hydroxide ($NH_4OH$), tetramethylammonium hydroxide (TMAH), potassium hydroxide (KOH), sodium hydroxide (NaOH) and calcium hydroxide ($Ca(OH)_2$). In other embodiments, the dissolution solution 245 may be an aqueous solution containing a ligand and an acid. Examples of acids that may be included within the dissolution solution 245 include, but are not limited to, hydrochloric acid (HCl), nitric acid ($HNO_3$) and sulfuric acid ($H_2SO_4$).

In some embodiments, the ligand may be added to the dissolution solution 245 to prevent oxidative damage on the exposed tungsten surface and prevent the base (or the acid) from attacking and removing the unmodified tungsten layer 205 underlying the tungsten halide passivation layer 225. In some embodiments, the ligand added to the dissolution solution 245 may react with and bind to the unmodified tungsten layer 205 to change the surface chemistry of the unmodified tungsten layer 205. In doing so, the ligand may prevent (or at least inhibit) parasitic oxidation of the unmodified tungsten layer 205 by blocking the unmodified tungsten surface. In other embodiments, the ligand added to the dissolution solution 245 may be a reducing agent that inhibits oxidation of the unmodified tungsten surface. As known in the art, a "reducing agent" is a chemical species that reduces another element, molecule or compound by donating an electron to the other element, molecule or compound (i.e., an electron recipient) during an oxidation-reduction reaction. During the reaction, the reducing agent loses an electron to, and absorbs oxygen from, the electron recipient. In doing so, the reducing agent becomes oxidized and the electron recipient becomes reduced (by losing an oxygen).

In some embodiments, the wet ALE process shown in FIG. 2 may prevent (or at least inhibit) parasitic oxidation of the unmodified tungsten surface and prevent continuous etching of the tungsten layer 205 during the dissolution step 240 by adding a ligand (or reducing agent) to the dissolution solution 245. Alternatively, a ligand may not be strictly needed in the dissolution solution 245 if small amounts of halogenated material are left on the tungsten surface after the dissolution step 240, as such material may prevent (or inhibit) parasitic oxidation similar to ligands. By forming a self-limiting tungsten halide passivation layer 225 during the surface modification step 200 and preventing reoxidation and continuous etching of the tungsten layer 205 during the dissolution step 240, the wet ALE process shown in FIG. 2 provides a post-etch surface roughness of the tungsten layer 205 that is substantially equal to an initial surface roughness of the tungsten layer 205 before etching.

A wide variety of ligands may be added to the dissolution solution 245. In some embodiments, the ligand added to the dissolution solution 245 may contain an ascorbate anion. For example, the ligand may be ascorbic acid ($C_6H_8O_6$), sodium ascorbate ($C_6H_7NaO_6$), calcium ascorbate ($C_{12}H_{14}CaO_{12}$) or potassium ascorbate ($KC_6H_7O_6$). Ascorbic acid is a water-soluble organic acid, whose conjugate base is the ascorbate anion. The ascorbate anion is a mild reducing agent and antioxidant (a compound that inhibits oxidation) that forms water-soluble salts when exposed to various metals, such as sodium ascorbate, calcium ascorbate and potassium ascorbate. On exposure to oxygen, ascorbic acid will undergo further oxidative decomposition to form various products such as, for example, oxalic acid. Ligands containing ascorbate anions (such as, e.g., ascorbic acid) prevent continuous etching of the tungsten layer 205 during the dissolution step 240 by preventing oxidative damage on the exposed tungsten surface and preventing the base (or the acid) from attacking and removing the unmodified tungsten layer 205. However, other reducing agents can also be used to prevent continuous etching of the tungsten layer during the dissolution step 240. For example, carboxylic acids (such as, e.g., oxalic acid ($C_2H_2O_4$), formic acid (HCOOH), acetic acid ($CH_3COOH$), etc.), amine-containing ligands (such as, e.g., ethylenediamine ($C_2H_8N_2$), ethylenediaminetetraacetic acid (EDTA, $C_{10}H_{16}N_2O_8$), iminodiacetic acid ($C_4H_7NO_4$) etc.) or other molecules that bind to the tungsten metal surface through N, P, O, or S heteroatoms can also be used in the dissolution solution 245. Although several different types of reducing agents may be used, ligands containing ascorbate anions (such as, e.g., ascorbic acid) may enable higher etch rates than ligands containing other anions (such as, e.g., formate anions, oxalate anions, etc.), and thus, may be preferred in some embodiments.

In one preferred embodiment, an aqueous basic solution comprising a ligand and a base may be used in the dissolution solution 245 to selectively remove a tungsten chloride (e.g., $WCl_x$) or tungsten oxychloride (e.g., $WO_yCl_{(x-2y)}$) passivation layer. The water within the aqueous basic solution hydrolyzes and removes the tungsten chloride or tungsten oxychloride passivation layer to expose the unmodified tungsten surface underlying the passivation layer. The base increases the extent of hydrolysis, and thus, the etch rate of the tungsten layer 205. The ligand inhibits oxidation of the unmodified tungsten surface and, in some cases, prevents the base from attacking and removing the unmodified tungsten surface and increasing the post-etch surface roughness of the tungsten layer 205 compared to the initial surface roughness of the tungsten layer 205 before etching. In some embodiments, the dissolution solution 245 may be an aqueous basic solution comprising 0.05 mM to 1 M of ammonium hydroxide ($NH_4OH$) and 0 mM to 10 mM ascorbic acid dissolved in water. In one example implementation, a dissolution solution 245 containing 5 mM of $NH_4OH$ and 10 mM of ascorbic acid dissolved in water may be used to provide self-limiting dissolution. However, other bases and ligands may be used in the dissolution solution 245 to increase the etch rate of the tungsten layer 205 and prevent parasitic oxidation of the unmodified tungsten surface while preserving the post-etch surface roughness.

Experimental Results

Etching experiments were conducted on 15 mm×15 mm coupons cut from a 300 mm silicon wafer with various thicknesses of tungsten deposited by physical vapor deposition (PVD) on one side to investigate the wet ALE process shown in FIG. 2. The etching experiments used to etch an exposed tungsten surface included multiple wet ALE cycles, where each cycle includes a dip in a surface modification solution 215 containing an example halogenation agent (e.g., TCCA) dissolved in various aqueous and non-aqueous solvents, followed by a first rinse step, a dip in an aqueous dissolution solution 245, and a second rinse step and blow dry. Each wet ALE process was repeated for a number of ALE cycles under different process conditions to investigate the etch rate achieved by the wet ALE process shown in FIG. 2 using various halogenation and dissolution chemistries. Additional etching experiments were conducted to investigate the effect that: (a) halogenation chemistry, temperature, concentration and time, (b) dissolution chemistry, temperature and time have on the etch rate.

Figure 3:
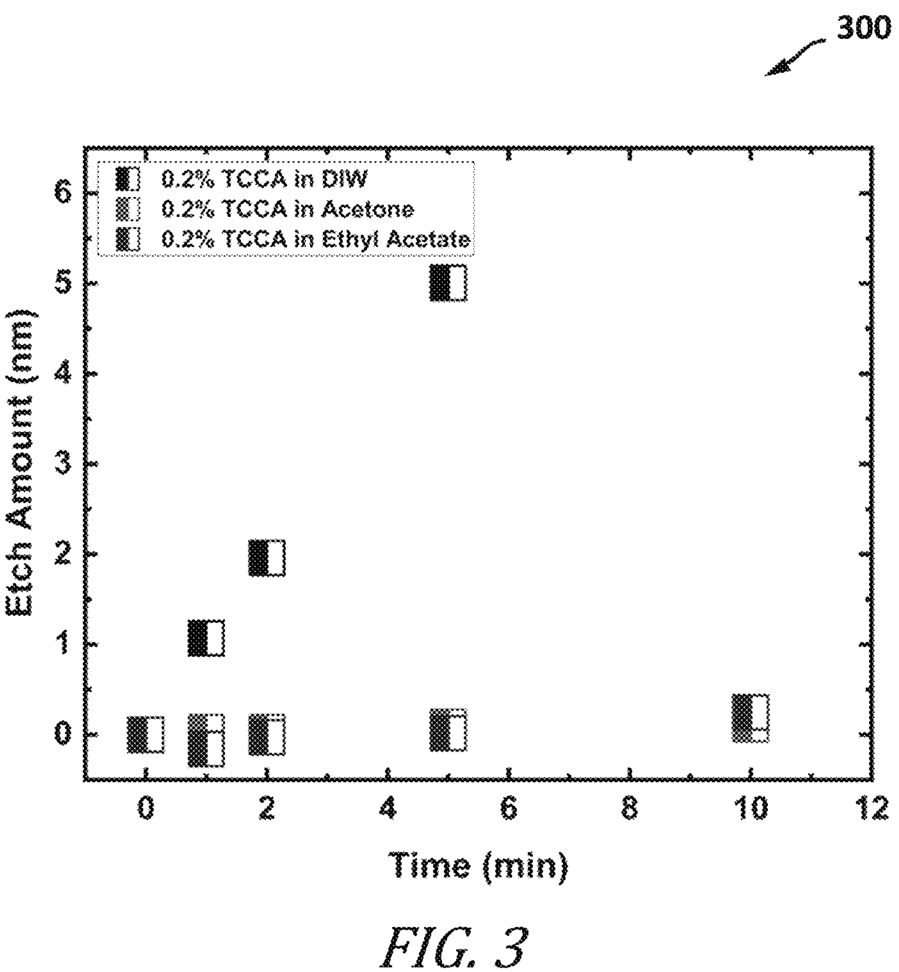
FIG. 3 is a graph depicting exemplary etch amounts (expressed in nanometers, nm) that may be achieved over time (expressed in minutes, min) when etching a tungsten surface using various surface modification solutions in the wet ALE process shown in FIG. 2.

The graph 300 shown in FIG. 3 depicts exemplary etch amounts (expressed in nanometers, nm) achieved over time (expressed in minutes, min) when etching a tungsten (W) surface using various surface modification solutions in the wet ALE process shown in FIG. 2. To obtain the results shown in the graph 300, the tungsten surface was exposed to three different surface modification solutions for a variable length of time (e.g., 0-10 minutes) to oxidize and halogenate the tungsten surface and form a tungsten halide passivation layer. Specifically, the tungsten surface was exposed to 0.2% TCCA in deionized water solution, 0.2% TCCA in acetone solution and 0.2% TCCA in ethyl acetate solution in three separate wet ALE processes. After performing the surface modification, rinse and dissolution steps, and repeating each wet ALE process for a number of cycles, 4-point probe (4pp) resistivity measurements were obtained to measure the etch amount achieved by the wet ALE processes.

As shown in the graph 300, halogenation of the tungsten surface is self-limiting in the non-aqueous surface modification solutions (0.2% TCCA in acetone or ethyl acetate). However, continuous etching occurs when the tungsten surface is exposed to an aqueous surface modification solution (0.2% TCCA in deionized water). TCCA in aqueous solution hydrolyzes to form hypochlorous acid (HClO), which reacts with the tungsten surface to form a tungsten oxide ($WO_x$), a soluble surface species in aqueous oxidizing solution. The solubility of the surface product is suppressed in the non-aqueous surface modification solutions. In the 0.2% TCCA in acetone and ethyl acetate solutions, TCCA acts as a halogenating agent that reacts with the tungsten surface to form a tungsten chloride or oxychloride passivation layer, which is stable and insoluble in the non-aqueous solvent.

Figure 4:
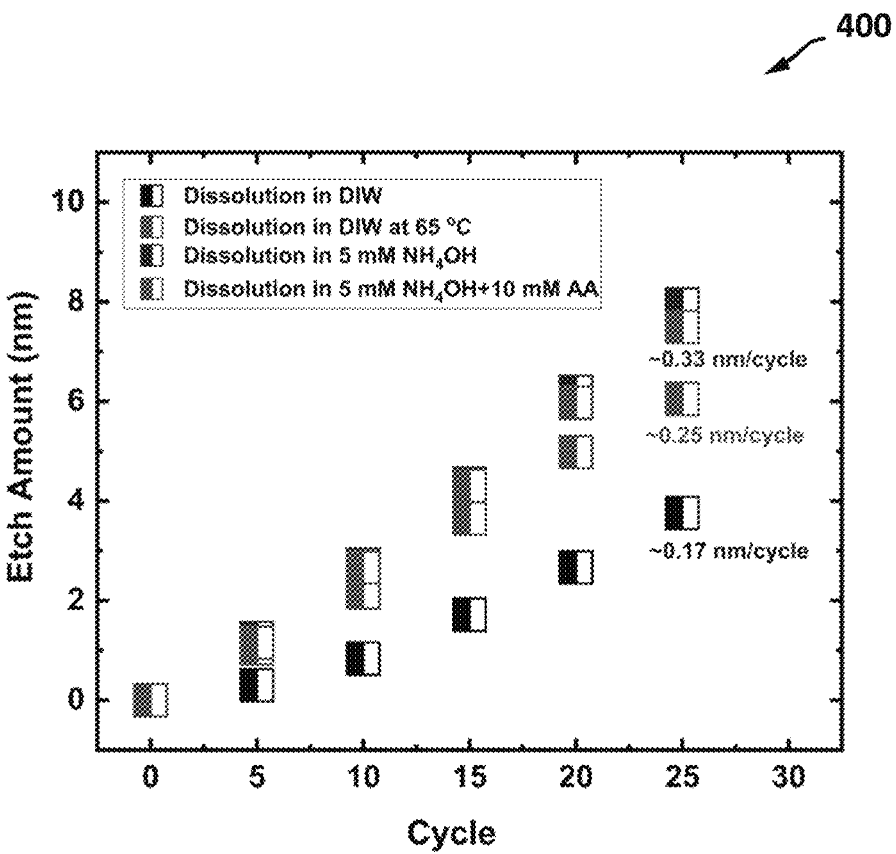
FIG. 4 is a graph depicting exemplary etch amounts (expressed in nm) that may be achieved per cycle (expressed in cycle number) when etching a tungsten surface using various dissolutions solutions in the wet ALE process shown in FIG. 2.

The graph 400 shown in FIG. 4 depicts exemplary etch amounts (expressed in nm) achieved per cycle (expressed in cycle number) when using various dissolutions solutions to selectively remove a tungsten halide passivation layer in the wet ALE process shown in FIG. 2. The etching experiments were conducted to investigate the tungsten etch rate as a function of dissolution chemistry using four different dissolution conditions: (a) dissolution in deionized water (DIW), (b) dissolution in DIW at 65° C., (c) dissolution in 5 mM $NH_4OH$ aqueous solution, and (d) dissolution in 5 mM $NH_4OH$ and 10 mM ascorbic acid (AA) aqueous solution. The etch recipe used to obtain the results shown in the graph 400 included multiple ALE cycles, where each cycle includes: (a) a 10 second dip in 0.1% TCCA in ethyl acetate solution, (b) an ethyl acetate, deionized water and IPA rinse and blow dry, (c) a 10 second dip in dissolution solution 'X,' and (d) a deionized water and IPA rinse and blow dry.

The graph 400 shows that the tungsten halide passivation layer can be removed via reactive dissolution/hydrolysis in deionized water with an etch rate of approximately 0.17 nm/cycle. The graph 400 further shows that the dissolution rate can be increased by increasing the dissolution temperature (e.g., from room temperature to 65° C.), or by adding a base (such as, e.g., $NH_4OH$) to the aqueous dissolution solution. The tungsten etch rate at the elevated (65° C.) dissolution temperature is approximately 0.25 nm/cycle, which is about 40% faster than the tungsten etch rate (~0.17 nm/cycle) achieved at room temperature. Adding a millimolar amount of $NH_4OH$ to the aqueous dissolution solution nearly doubles the tungsten etch rate (~0.33 nm/cycle) compared to DIW alone (~0.17 nm/cycle). A similar etch rate (~0.33 nm/cycle) is achieved in the $NH_4OH$+ascorbic acid (AA) solution.

Figure 5:
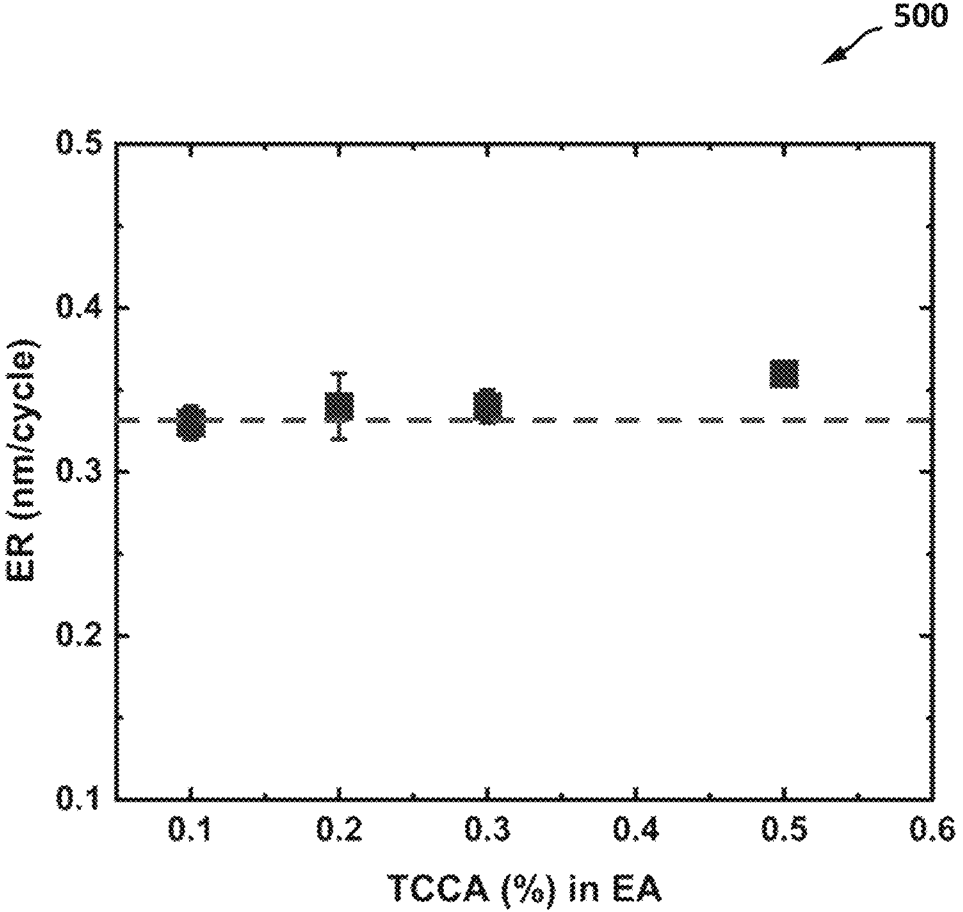
FIG. 5 is a graph depicting exemplary etch rates (expressed in nm/cycle) achieved as a function of trichloroisocyanuric acid (TCCA) concentration (expressed %) when etching a tungsten surface using various concentrations of TCCA dissolved in ethyl acetate in the surface modification solution and 5 mM of $NH_4OH$+10 mM of ascorbic acid dissolved in water in the dissolution solution.

An additional etch experiment was performed to investigate the effect of chlorination concentration on the tungsten etch rate. The graph 500 shown in FIG. 5 depicts exemplary etch rates (expressed in nm/cycle) achieved as a function of trichloroisocyanuric acid (TCCA) concentration when using various concentrations (e.g., 0.1%-0.5%) of TCCA dissolved in ethyl acetate to oxidize and chlorinate the tungsten surface. The etch recipe used to obtain the results shown in the graph 500 included multiple ALE cycles, where each cycle includes: (a) a 10 second dip in X % TCCA in ethyl acetate solution, (b) an ethyl acetate, deionized water and IPA rinse and blow dry, (c) a 10 second dip in 5 mM $NH_4OH$+10 mM ascorbic acid solution, and (d) a deionized water and IPA rinse and blow dry. As shown in the graph 500, a nearly constant etch rate (~0.33 nm/cycle) is achieved in the different TCCA-ethyl acetate solutions, indicating the tungsten etch is self-limiting at the TCCA concentrations under study.

Figure 6A:
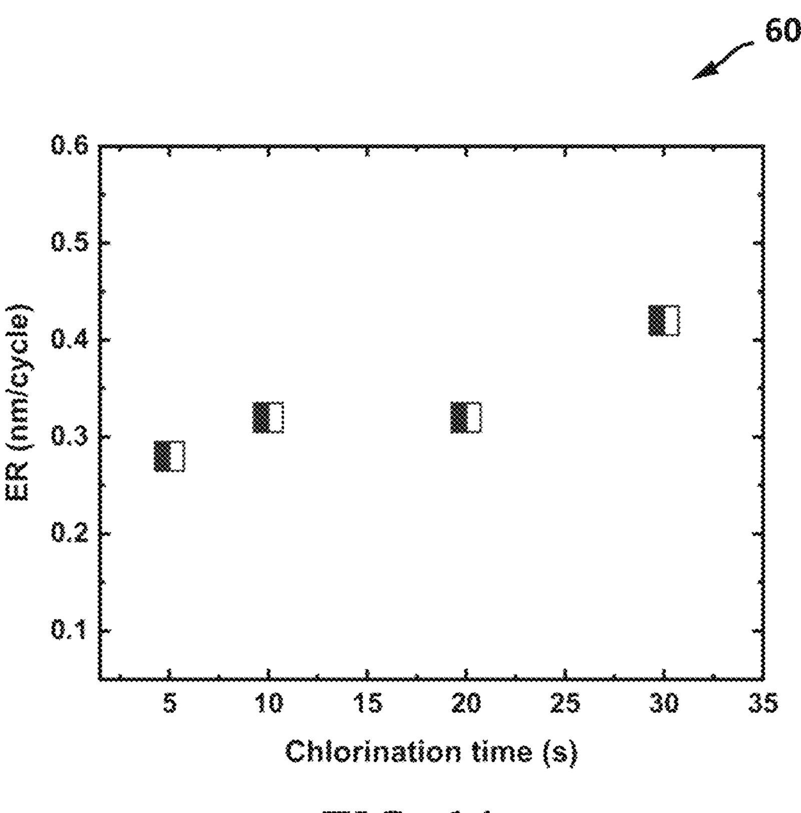
FIG. 6A is a graph depicting exemplary etch rates (expressed in nm/cycle) achieved as a function of chlorination time (expressed in seconds, s) when etching a tungsten surface using 0.1% TCCA dissolved in ethyl acetate in the surface modification solution and 5 mM of $NH_4OH$ +10 mM of ascorbic acid dissolved in water in the dissolution solution.
Figure 6B:
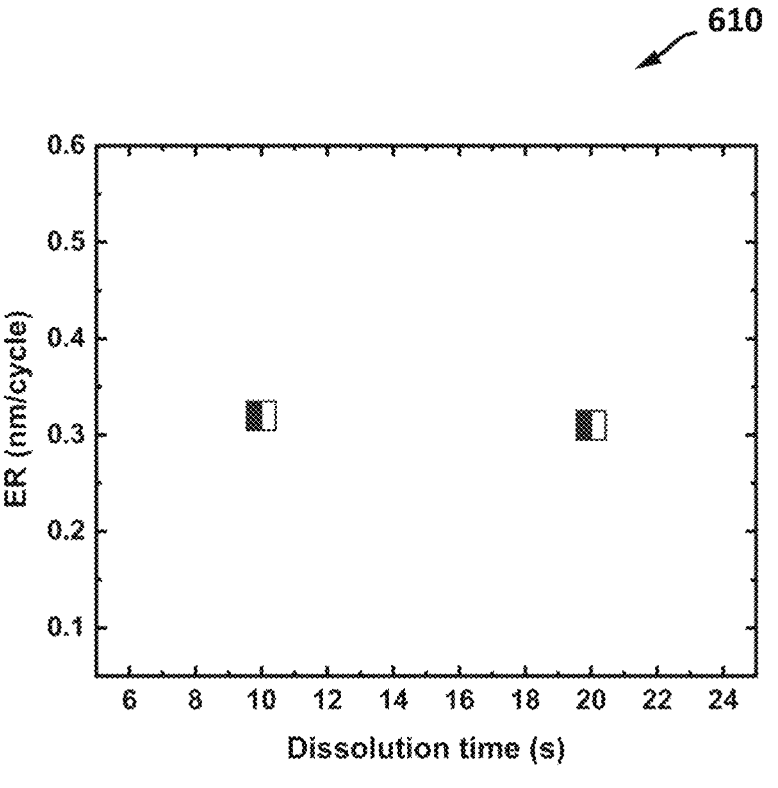
FIG. 6B is a graph depicting exemplary etch rates (expressed in nm/cycle) achieved as a function of dissolution time (expressed in seconds, s) when etching a tungsten surface using 0.1% TCCA dissolved in ethyl acetate in the surface modification solution and 5 mM of $NH_4OH$+10 mM of ascorbic acid dissolved in water in the dissolution solution.

Additional etch experiments were performed to investigate the tungsten etch rate as a function of chlorination and dissolution time to examine the ALE window. The graphs 600 and 610 shown in FIGS. 6A-6B depict exemplary etch rates (expressed in nm/cycle) achieved as a function of chlorination time (expressed in seconds, s) and dissolution time (expressed in seconds, s), respectively, when etching a tungsten surface using 0.1% TCCA dissolved in ethyl acetate in the surface modification solution and 10 mM of ascorbic acid dissolved in 5 mM of $NH_4OH$ and water in the dissolution solution.

To obtain the results shown in the graph 600, the tungsten surface was dipped in 0.1% TCCA-ethyl acetate solution for different amounts of time (e.g., 5-30 seconds) to form a tungsten halide passivation layer, followed by the removal of the tungsten halide passivation layer in 5 mM $NH_4OH$ solution+10 mM ascorbic acid solution. The graph 600 shows the tungsten etch rate (ER) as a function of chlorination time. A constant tungsten ER (~0.33 nm/cycle) in between 10-20 seconds chlorinating time indicates the existence of an ALE window. A continuous tungsten etch past the ALE window indicates the presence of multiple surface species.

To obtain the results shown in the graph 610, the tungsten surface was dipped in 0.1% TCCA-ethyl acetate solution for 10 seconds to form a tungsten halide passivation layer, followed by removal of the tungsten halide passivation layer in 5 mM $NH_4OH$+10 mM ascorbic acid solution for different amounts of time (e.g., 10-20 seconds). The graph 610 shows the tungsten etch rate (ER) as a function of dissolution time. A constant tungsten ER (~0.33 nm/cycle) in between 10-20 seconds dissolution time indicates that removal of the tungsten halide passivation layer is self-limiting with time.

Figure 7A:
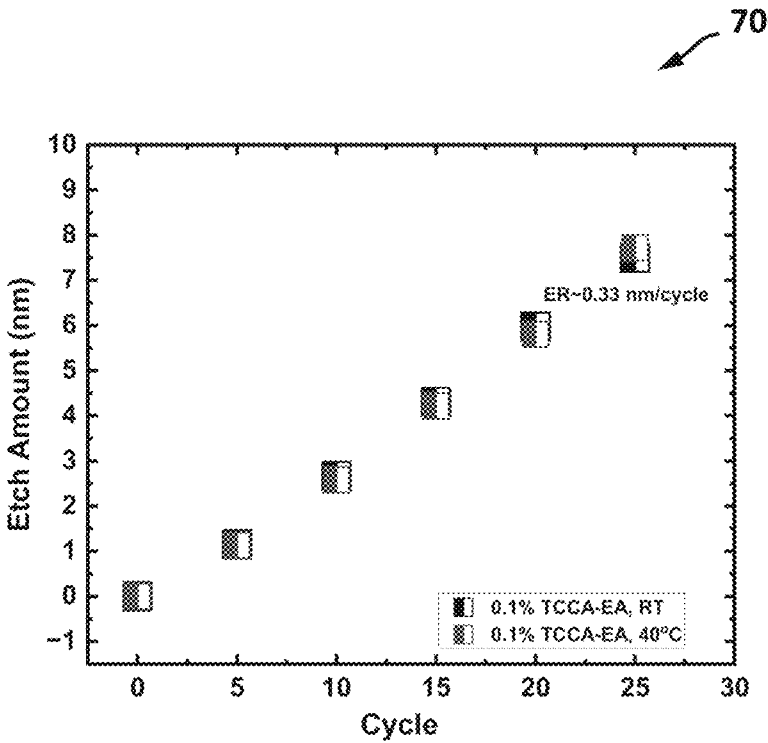
FIG. 7A is a graph depicting the effect of chlorination temperature (expressed in ° C.) on etch rate (expressed in nm/cycle) when etching a tungsten surface using 0.1% TCCA dissolved in ethyl acetate in the surface modification solution and 5 mM of $NH_4OH$+10 mM of ascorbic acid dissolved in water in the dissolution solution.

The graph 700 shown in FIG. 7A illustrates the effect of chlorination temperature on tungsten etch rate. FIG. 7 shows the tungsten etch amount (expressed in nm) as a function of cycle number under two different chlorinating conditions. To obtain the results shown in the graph 700, the tungsten surface was modified by dipping it in 0.1% TCCA-ethyl acetate solution: (a) at room temperature, and (b) at 40° C. The modified layer was selectively removed in 5 mM $NH_4OH$+10 mM ascorbic acid solution. A constant tungsten etch rate was achieved for both conditions, suggesting that the thickness of modified surface layer is the same for both. A constant tungsten ER at the elevated chlorination temperature suggests that tungsten surface modification at higher temperature is strictly self-limiting and solution phase kinetics are unimportant.

Figure 7B:
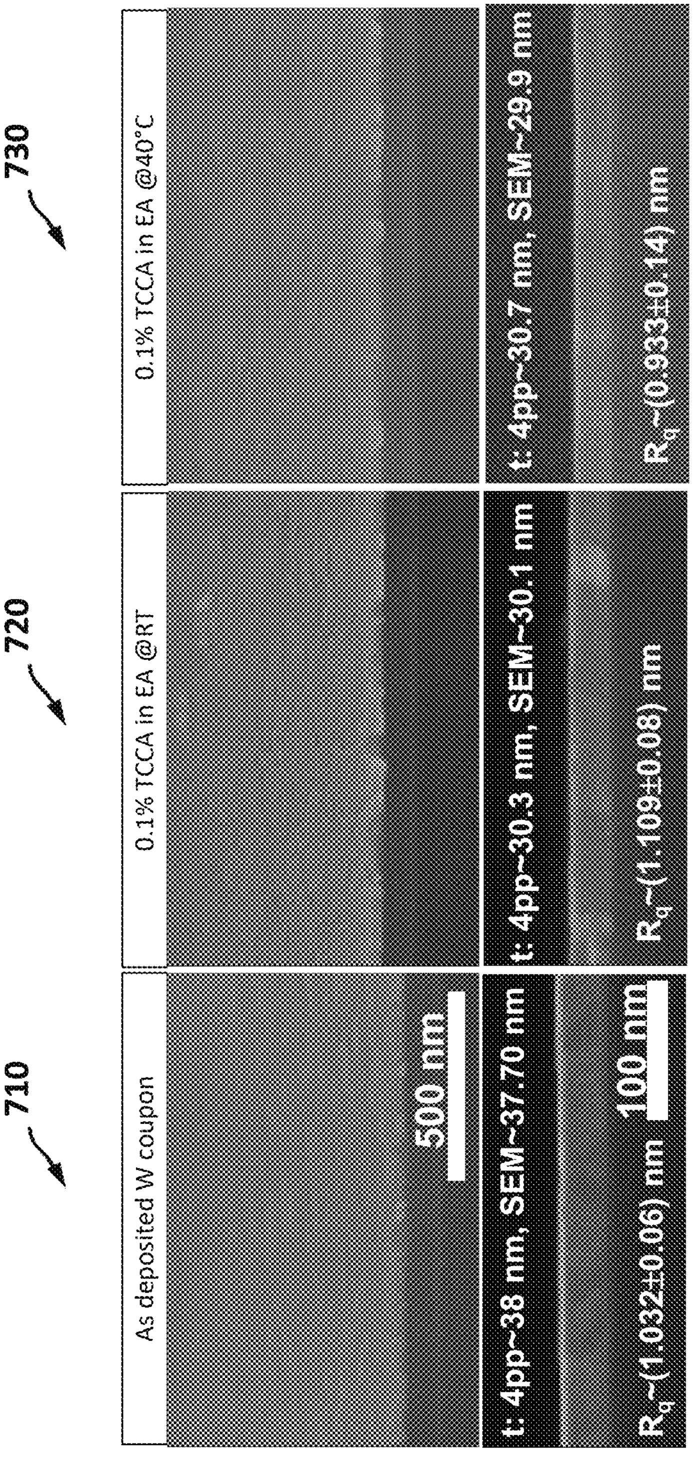
FIG. 7B provides scanning electron microscope (SEM) images depicting an as-deposited tungsten surface and post-etch tungsten surfaces for the various etch conditions shown in FIG. 7A, illustrating the effect of chlorination temperature on post-etch surface roughness.

Top down and tilt view scanning electron microscope (SEM) images of as-deposited tungsten (710) and post-etch tungsten (720, 730) were obtained for the various etch conditions shown in FIG. 7A to investigate the effect of chlorination temperature on the post-etch surface roughness. The SEM images 710-730 are shown in FIG. 7B. In the post-etch SEM images (720, 730), the etch amount was calculated from 4-point probe (4pp) resistivity measurements of the tungsten film and the etch amount measured by SEM cross section are in good agreement. The tilt view SEM images (top images) show preserved surface smoothness (up to about 8 nm) in the post-etch tungsten coupon, irrespective of chlorination temperature. Further etch experiments (shown in FIG. 7C) show the root mean square (RMS) surface roughness of the post-etch tungsten coupon is also independent of TCCA concentration. The preserved surface smoothness can be attributed to the formation of a conformal tungsten halide passivation layer preventing continuous tungsten etch. The cross-sectional SEM images (bottom images) show that material removal in the post-etch coupon is even. The thickness of post-etch tungsten coupon measured from 4 pp measurement method is nearly the same as the thickness measured from SEM images, an indication of conformality on materials removal.

Figure 7C:
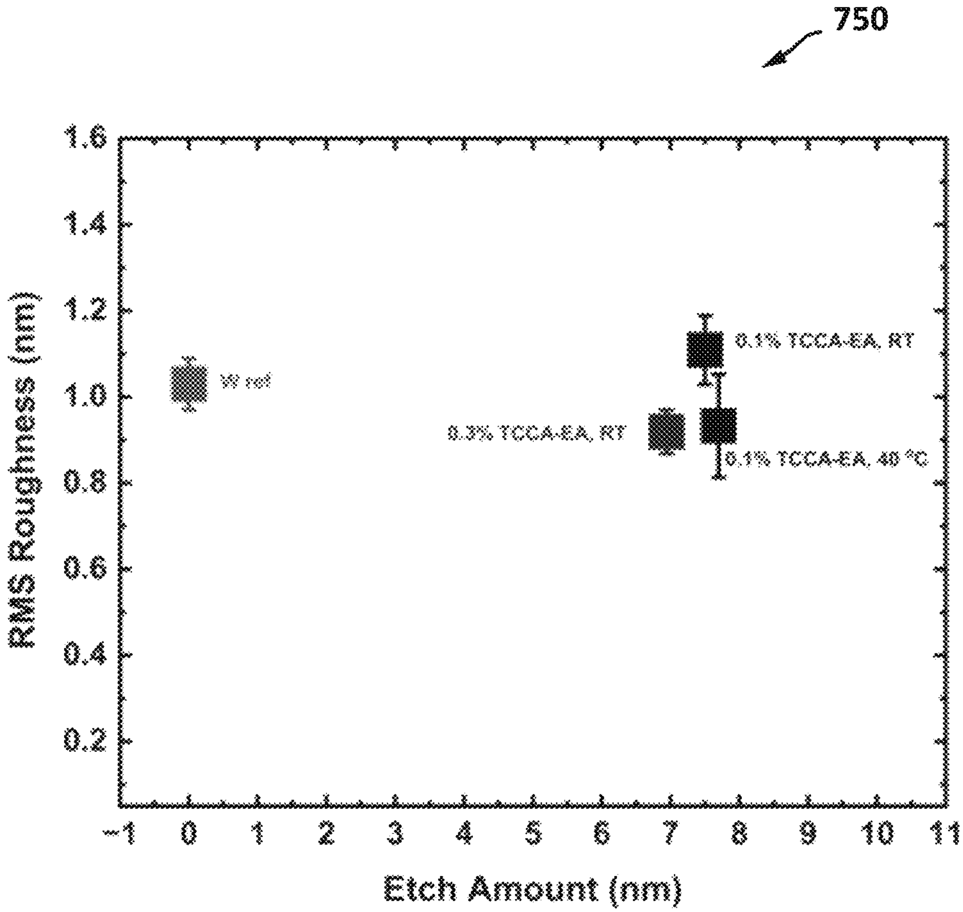
FIG. 7C is a graph depicting root mean square (RMS) roughness (expressed in nm) of an as-deposited tungsten surface and post-etch tungsten surfaces as a function of etch amount (expressed in nm) for two different chlorinating solutions under different conditions.

The graph 750 shown in FIG. 7C illustrates the RMS roughness of the as-deposited and post-etch tungsten coupon as a function of etch amount (expressed in nm) for two different chlorinating solutions under different conditions. The graph 750 shows the RMS roughness (0.92±0.05 nm) of the post-etch tungsten coupon using 0.3% TCCA-ethyl acetate solution for about 7 nm tungsten etch is less than the RMS roughness (1.03±0.06 nm) of the as-deposited tungsten reference coupon. The RMS roughness of the post-etch tungsten coupon in the 0.1% TCCA-ethyl acetate solution at room temperature (1.02±0.14 nm) and at an elevated chlorination temperature of 40° C. (0.933±0.12 nm) shows the preserved surface smoothness after about 8 nm of material removal off the tungsten surface. Preserved surface smoothness in the post-etch coupon can be attributed to the formation of a conformal passivation layer, which can be selectively dissolved in an aqueous dissolution solution (such as, e.g., $NH_4OH$ with/without millimolar of ascorbic acid).

Co-pending U.S. patent application Ser. No. 18/619,491, entitled "Methods for Wet Atomic Layer Etching of Tungsten," discloses a tungsten wet ALE process and method that focuses on oxidation of the tungsten surface as the preferred route of tungsten surface modification. In the co-pending application, different oxidizers such as hydrogen peroxide ($H_2O_2$), ammonium persulphate (APS, $[(NH_4)_2S_2O_8]$), $UVO_3$, and OH* can be used to oxide tungsten and form a tungsten trioxide ($WO_3$) passivation layer, which is self-limiting and insoluble in the oxidizing solution.

As shown in the etching experiments above, the tungsten surface modification is also self-limiting in non-aqueous chlorinating solutions (such as, e.g., TCCA-ethyl acetate and TCCA-acetone). Self-limiting behavior during the surface modification step is attributed to the formation of a tungsten halide passivation layer (e.g., a tungsten chloride ($WCl_x$) or tungsten oxychloride ($WO_yCl_{(x-2y)}$) passivation layer), which is insoluble in the non-aqueous solvents used in the surface modification solution. The modified tungsten layer is subsequently removed via reactive dissolution/hydrolysis in aqueous solution. The rate of reactive dissolution can be increased by increasing the dissolution temperature. In addition or alternatively, a strong base (or an acid) can be added to the aqueous dissolution solution to speed up reactive dissolution, as hydroxide ions (OH—) provide an alternate mechanism that is energetically more favorable. The etching experiments provided herein further show that the tungsten etch rate (ER) is self-limiting with the TCCA concentration under study, and the post etch surface morphology is preserved independent of TCCA concentration and chlorinating temperature. The preserved surface smoothness in the post-etch tungsten coupon can be attributed to the formation of a conformal tungsten halide as a passivation layer that prevents continuous tungsten etch.

Figure 8:
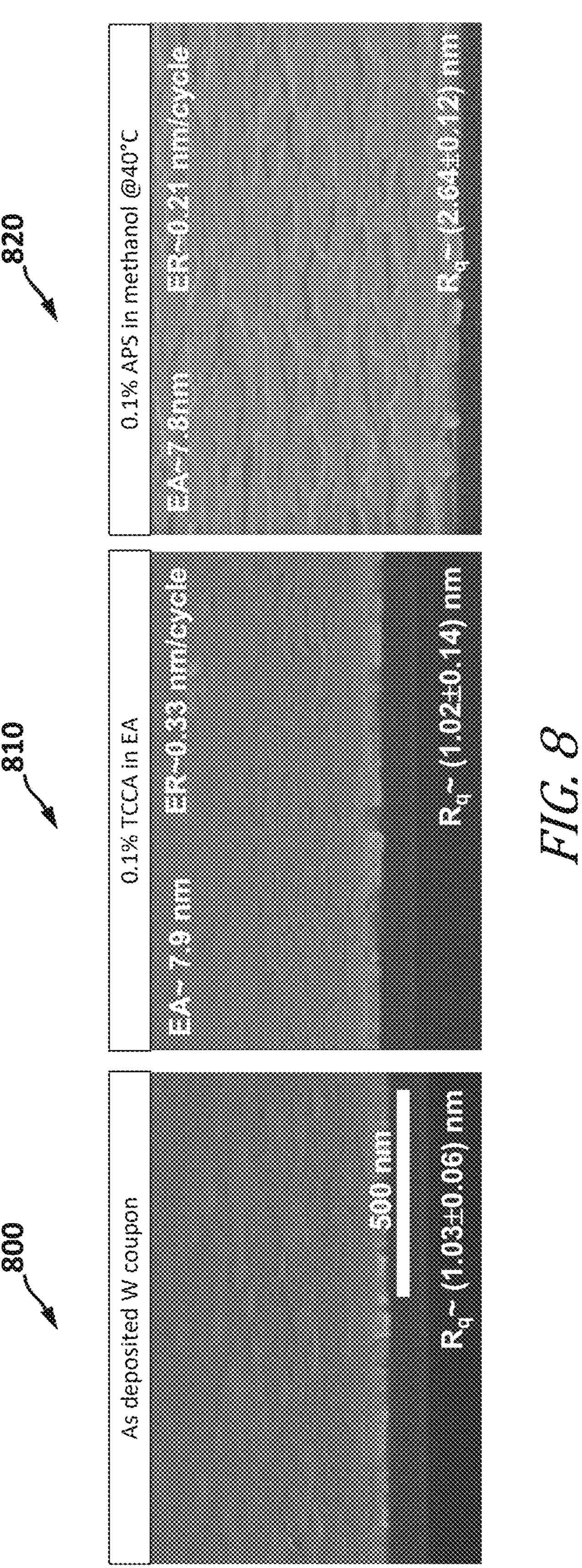
FIG. 8 provides SEM images depicting an as-deposited tungsten surface and post-etch tungsten surfaces when using various oxidizing and chlorinating solutions to oxidize the tungsten surface.

FIG. 8 provides SEM images of an as-deposited tungsten coupon (800) and post-etch tungsten coupons (810, 820) after using various oxidizing and chlorinating solutions to modify the tungsten surface. The post-etch SEM image 810 shows etch results obtained after dipping the tungsten surface in 0.1% TCCA-ethyl acetate solution to form a tungsten halide (e.g., $WCl_x$ or $WO_yCl_{(x-2y)}$) passivation layer, followed by removal of the passivation layer in 5 mM $NH_4OH$+10 mM ascorbic acid solution. The post-etch SEM image 820 shows etch results obtained after dipping the tungsten surface in 0.1% APS in methanol solution at 40° C. to form a tungsten oxide (e.g., $WO_3$) passivation layer, followed by removal of the passivation layer in 2 mM $NH_4OH$+10 mM ascorbic acid solution. The SEM images depicted in FIG. 8 show that the chlorinating chemistry used herein to oxidize and halogenate the tungsten surface provides a faster etch rate (~0.33 nm/cycle) than the oxidizing chemistry (~0.21 nm/cycle) used in the co-pending application, while preserving the surface smoothness.

Figure 9:
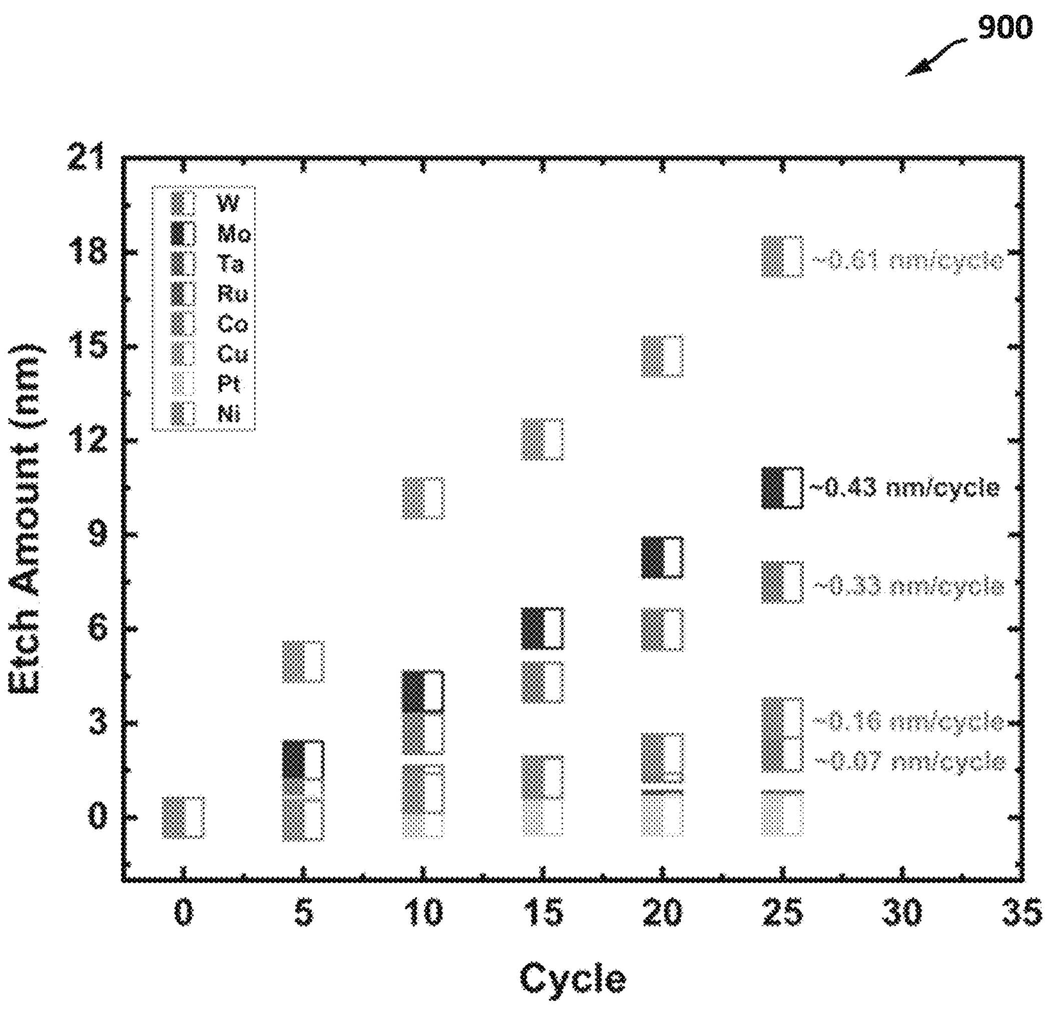
FIG. 9 is a graph depicting exemplary etch rates (expressed in nm/cycle) achieved as a function of cycle (expressed in cycle number) when etching various transition metal surfaces using 0.1% TCCA dissolved in ethyl acetate in the surface modification solution and 5 mM of $NH_4OH$ and 10 mM of ascorbic acid dissolved in water in the dissolution solution.

Additional etch experiments were performed to investigate the selectivity of the etch chemistry disclosed herein to various transition metals. The graph 900 shown in FIG. 9 depicts exemplary etch rates (expressed in nm/cycle) achieved as a function of cycle (expressed in cycle number) when etching tungsten (W), molybdenum (Mo), tantalum (Ta), ruthenium (Ru), cobalt (Co), copper (Cu), platinum (Pt) and nickel (Ni) surfaces using 0.1% TCCA dissolved in ethyl acetate in the surface modification solution and 5 mM of $NH_4OH$ and 10 mM of ascorbic acid dissolved in water in the dissolution solution. The etch recipe used to obtain the results shown in the graph 900 included multiple ALE cycles, where each cycle includes: (a) a 10 second dip in 0.1% TCCA in ethyl acetate solution, (b) an ethyl acetate, deionized water and IPA rinse and blow dry, (c) a 10 second dip in 5 mM $NH_4OH$+10 mM ascorbic acid solution, and (d) a deionized water and IPA rinse and blow dry.

As shown in the graph 900, the etch chemistry disclosed herein provides a tungsten etch rate of about 0.33 nm/cycle. The tungsten etch is highly selective to tantalum (Ta), ruthenium (Ru) and platinum (Pt), which are not etched by the etch chemistry disclosed herein. It is presumed that the low (e.g., 0.1-0.5%) TCCA concentrations used to halogenate the tungsten surface are not sufficient to break the surface bonds on Ta, Ru and Pt surfaces, due to the higher surface binding energy of such surfaces. The graph 900 further shows that selectivity between tungsten (~0.33 nm/cycle) and copper (~0.61 nm/cycle) or molybdenum (~0.43 nm/cycle) is poor. However, copper and molybdenum show excellent selectivity with cobalt (Co, ~0.07 nm/cycle), tantalum (Ta), ruthenium (Ru) and platinum (Pt).

FIG. 10 illustrates another embodiment of a method 1000 that can be used for etching a substrate using a wet ALE process. More specifically, FIG. 10 illustrates a method 1000 that can be used to etch a substrate having a tungsten (W) layer formed thereon using a wet ALE process, which utilizes halogenation to modify a tungsten surface and form a self-limiting tungsten halide passivation layer. It will be recognized that the embodiment of FIG. 10 is merely exemplary and additional methods may utilize the wet ALE techniques described herein. Further, additional processing steps may be added to the method shown in the FIG. 10 as the steps described are not intended to be exclusive. Moreover, the order of the steps is not limited to the order shown in the figures as different orders may occur and/or various steps may be performed in combination or at the same time.

The method 1000 shown in FIG. 10 begins by receiving the substrate, the substrate having a tungsten (W) layer formed thereon, wherein a tungsten surface is exposed on a surface of the substrate (in step 1010). Then, in step 1020, the method 1000 includes selectively etching the tungsten layer by performing multiple cycles of the wet ALE process, wherein each cycle comprises: (a) exposing the tungsten surface to a first etch solution comprising an electrophilic chlorinating agent dissolved in a non-aqueous solvent to form a chemically modified W surface layer that is self-limiting and insoluble in the non-aqueous solvent; (b) rinsing the substrate with a first purge solution to remove the first etch solution from the surface of the substrate; (c) exposing the chemically modified W surface layer to a second etch solution to selectively dissolve the chemically modified W surface layer and expose an unmodified tungsten surface underlying the chemically modified W surface layer; and (d) rinsing the substrate with a second purge solution to remove the second etch solution from the surface of the substrate and etch the tungsten layer.

In the method 1000, the electrophilic chlorinating agent reacts with the tungsten surface to form a tungsten chloride or tungsten oxychloride passivation layer, which is self-limiting and insoluble in the non-aqueous solvent. In some embodiments, a concentration of the electrophilic chlorination agent in the first etch solution may be selected to avoid substantially increasing a post-etch surface roughness of the tungsten layer compared to an initial surface roughness of the tungsten layer before etching.

A wide variety of electrophilic chlorinating agents and non-aqueous solvents may be utilized in the first etch solution, as described above. In some embodiments, the electrophilic chlorinating agent may be trichloroisocyanuric acid (TCCA) and the non-aqueous solvent may be a polar organic solvent. In some embodiments, the TCCA concentration in the first etch solution may range between 0.05% and 0.5%. In one example embodiment, the first etch solution may comprise 0.1% TCCA dissolved in ethyl acetate or acetone.

In some embodiments, the second etch solution may be an aqueous solution comprising a base dissolved in water. In such embodiments, the tungsten chloride or tungsten oxychloride passivation layer is selectively dissolved by the water to expose the unmodified tungsten surface underlying the tungsten chloride or tungsten oxychloride passivation layer. The base included within the second etch solution increases the dissolution rate of the tungsten chloride or tungsten oxychloride passivation layer to increase the etch rate of the tungsten layer. In some embodiments, the second etch solution may further include a ligand, which prevents or inhibits oxidation of the unmodified tungsten surface after the tungsten chloride or tungsten oxychloride passivation layer is removed.

A wide variety of bases and ligands may be utilized in the second etch solution, as described above. For example, the base may be ammonium hydroxide ($NH_4OH$), tetramethylammonium hydroxide (TMAH), potassium hydroxide (KOH) or calcium hydroxide ($Ca(OH)_2$), and the ligand may be ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid. In one example embodiment, the second etch solution may include 0 mM to 10 mM ascorbic acid dissolved in 0.05 mM to 1 M of ammonium hydroxide ($NH_4OH$) and water.

The methods and wet ALE processes described above and shown in FIGS. 1, 2 and 10 for etching tungsten can be accomplished using a variety of techniques. For example, the tungsten wet ALE processes disclosed above may be performed by dipping the tungsten sample in beakers of each etch solution. In this case, purging can be accomplished by either rinsing or dipping the sample in an appropriate solvent bath. The tungsten wet ALE processes can also be accomplished on a spinner. For example, the tungsten sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of metal. For high volume manufacturing, dispensing of etch solutions and rinses can be executed using conventional tools, such as wet etching tools and rinse tools.

Example process conditions (e.g., etch chemistry, temperature, processing time, etc.) are provided herein for etching transition metals, and more specifically, for etching tungsten using the methods and wet ALE processes described above and shown in FIGS. 1, 2 and 10. It will be recognized by those skilled in the art, however, that the methods and wet ALE processes disclosed herein are not strictly limited to the example process conditions described herein and may be performed using a wide variety of process conditions depending on the material being etched.

Figure 11:
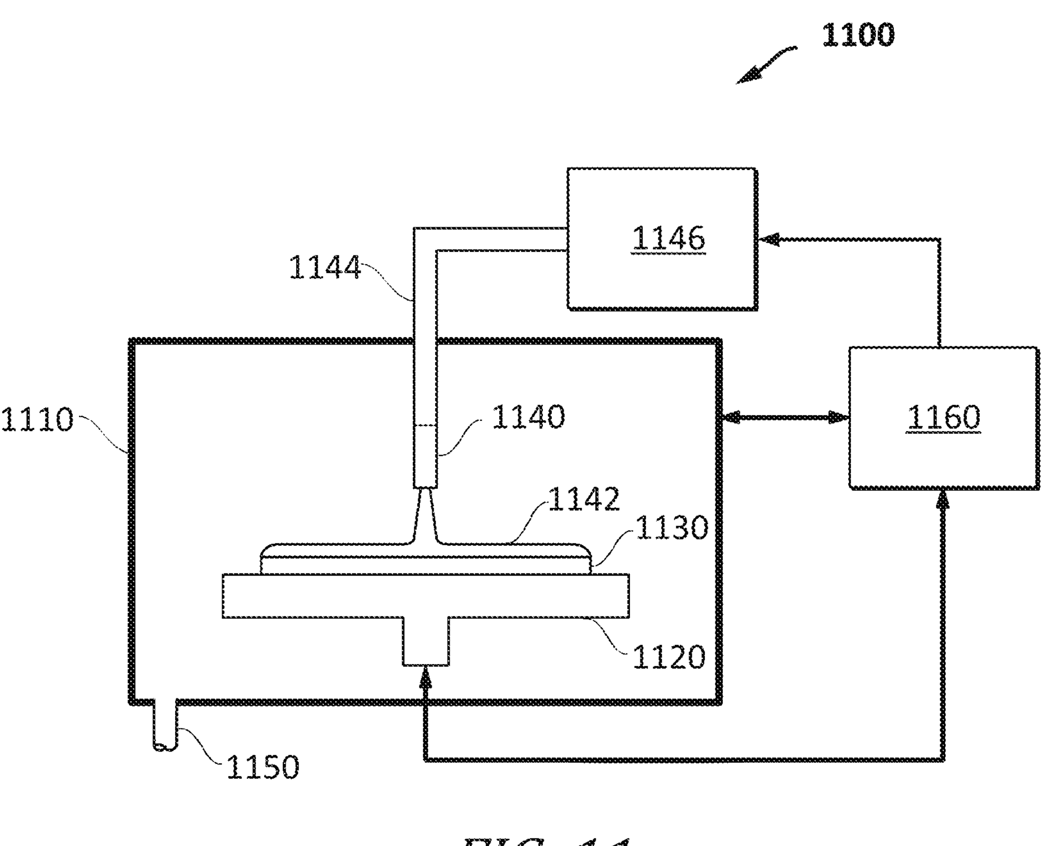
FIG. 11 is a block diagram illustrating one embodiment of a processing system that can be used to etch a transition metal surface, such as a tungsten surface, using the wet ALE processes disclosed herein.

FIG. 11 illustrates one embodiment of a processing system 1100 that can etch a transition metal surface, such as a tungsten surface, on a surface of a substrate 1130 using the wet ALE processes disclosed herein. As shown in FIG. 11, the processing system 1100 includes a process chamber 1110, which in some embodiments, may be a pressure controlled chamber. In the embodiment shown in FIG. 11, the process chamber 1110 is a spin chamber having a spinner 1120 (or spin chuck), which is configured to spin or rotate at a rotational speed. A substrate 1130 is held on the spinner 1120, for example, via electrostatic force or vacuum pressure. In one example, the substrate 1130 may be a semiconductor wafer having a transition metal, such as tungsten, formed on or within the substrate 1130.

The processing system 1100 shown in FIG. 11 further includes a liquid nozzle 1140, which is positioned over the substrate 1130 for dispensing various etch solutions 1142 onto a surface of the substrate 1130. The etch solutions 1142 dispensed onto the surface of the substrate 1130 may generally include a surface modification solution to chemically modify the tungsten surface and form a modified surface layer (e.g., a tungsten chloride or tungsten oxychloride passivation layer), and a dissolution solution to selectively remove the modified surface layer from the tungsten surface. Purge solutions may also be dispensed onto the surface of the substrate 1130 between surface modification and dissolution steps to separate the surface modification and dissolution solutions. Examples of surface modification, dissolution and purge solutions are discussed above.

As shown in FIG. 11, the etch solutions 1142 may be stored within a chemical supply system 1146, which may include one or more reservoirs for holding the various etch solutions 1142 and a chemical injection manifold, which is fluidly coupled to the process chamber 1110 via a liquid supply line 1144. In operation, the chemical supply system 1146 may selectively apply desired chemicals to the process chamber 1110 via the liquid supply line 1144 and the liquid nozzle 1140 positioned within the process chamber 1110. Thus, the chemical supply system 1146 can be used to dispense the etch solutions 1142 onto the surface of the substrate 1130. The process chamber 1110 may further include a drain 1150 for removing the etch solutions 1142 from the process chamber 1110.

Components of the processing system 1100 can be coupled to, and controlled by, a controller 1160, which in turn, can be coupled to a corresponding memory storage unit and user interface (not shown). Various processing operations can be executed via the user interface, and various processing recipes and operations can be stored in the memory storage unit. Accordingly, a given substrate 1130 can be processed within the process chamber 1110 in accordance with a particular recipe. In some embodiments, a given substrate 1130 can be processed within the process chamber 1110 in accordance with an etch recipe that utilizes the wet ALE techniques described herein for etching tungsten.

The controller 1160 shown in block diagram form in FIG. 11 can be implemented in a wide variety of manners. In one example, the controller 1160 may be a computer. In another example, the controller 1160 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 11, the controller 1160 may be coupled to various components of the processing system 1100 to receive inputs from, and provide outputs to, the components. For example, the controller 1160 may be coupled to: the process chamber 1110 for controlling the temperature and/or pressure within the process chamber 1110; the spinner 1120 for controlling the rotational speed of the spinner 1120; and the chemical supply system 1146 for controlling the various etch solutions 1142 dispensed onto the substrate 1130. The controller 1160 may control other processing system components not shown in FIG. 11, as is known in the art.

In some embodiments, the controller 1160 may control the various components of the processing system 1100 in accordance with an etch recipe that utilizes the wet ALE techniques described herein for etching tungsten (W). For example, the controller 1160 may supply various control signals to the chemical supply system 1146, which cause the chemical supply system 1146 to: a) dispense a surface modification solution onto the surface of the substrate 1130 to chemically modify exposed surfaces of the tungsten and create a chemically modified W surface layer (e.g., a tungsten chloride or tungsten oxychloride passivation layer) on the substrate 1130; b) rinse the substrate 1130 with a first purge solution to remove the surface modification solution and excess reactants from the surface; c) dispense a dissolution solution onto the surface of the substrate 1130 to selectively remove or dissolve the chemically modified W surface layer; and d) rinse the substrate with a second purge solution to remove the dissolution solution from the surface of the substrate 1130. In some embodiments, the controller 1160 may supply the control signals to the chemical supply system 1146 in a cyclic manner, such that the steps a)-d) are repeated for one or more ALE cycles, until a desired amount of the tungsten has been removed.

The controller 1160 may also supply control signals to other processing system components. In some embodiments, for example, the controller 1160 may supply control signals to the spinner 1120 and/or the chemical supply system 1146 to dry the substrate 1130 after the second purge step is performed. In one example, the controller 1160 may control the rotational speed of the spinner 1120, so as to dry the substrate 1130 in a spin dry step. In another example, control signals supplied from the controller 1160 to the chemical supply system 1146 may cause a drying agent (such as, e.g., isopropyl alcohol) to be dispensed onto the surface of the substrate 1130 to further assist in drying the substrate before performing the spin dry step.

In some embodiments, the controller 1160 may control the temperature and/or the pressure within the process chamber 1110. In some embodiments, the surface modification, dissolution and purge steps of the tungsten wet ALE processes described herein may be performed at roughly the same temperature and pressure. In one example implementation, the surface modification, dissolution and purge steps may each be performed at (or near) atmospheric pressure and room temperature. Performing the processing steps within the same process chamber at roughly the same temperature and pressure decreases the cycle time and improves the throughput of the wet ALE process described herein by avoiding unnecessary chamber transitions and temperature/pressure changes.

It is noted, however, that the embodiments described herein are not strictly limited to only atmospheric pressure and room temperature, nor are they limited to a particular process chamber. In other embodiments, one or more of the surface modification, dissolution and purge steps can be run at above atmospheric pressure in a pressure vessel, or at reduced pressure in a vacuum chamber. Etch solutions can be dispensed in these environments as long as the vapor pressure of the liquid is lower than the chamber pressure. For these implementations, a spinner with a liquid dispensing nozzle would be placed in the pressure vessel or vacuum chamber. The temperature of the liquid being dispensed can be elevated to any temperature below its boiling point at the pressure of the process. In one example implementation, the dissolution step may be performed at an elevated temperature (for example, at about 65° C.) to increase the dissolution rate and increase the tungsten etch rate.

The present disclosure provides systems and methods that utilize new etch chemistries for etching tungsten (W) in a wet ALE process. As described above, the wet ALE processes and methods disclosed herein use a wide variety of techniques and etch chemistries to oxidize and halogenate a tungsten layer exposed on a surface of a substrate and form a self-limiting, tungsten halide passivation layer in a surface modification step of the wet ALE process. After forming the tungsten halide passivation layer, reactive dissolution in aqueous solution is used in the dissolution step of the wet ALE process to provide self-limited, selective dissolution of the tungsten halide passivation layer without significantly increasing the post-etch surface roughness. Low concentrations of halogenation agents and bases are respectively used in the surface modification and dissolution solutions to preserve surface roughness, while maintaining an acceptable tungsten etch rate.

Although described herein for etching tungsten (W), the techniques described herein may be used for etching other transition metals such as, for example, copper (Cu) and molybdenum (Mo). However, the relatively low concentration (e.g., 0.1-0.5%) of TCCA used to modify the tungsten surface may not be sufficient to modify other transition metal surfaces such as, tantalum (Ta), ruthenium (Ru), cobalt (Co), platinum (Pt) and nickel (Ni). Thus, the etch chemistries and methods disclosed herein for etching tungsten (W) may provide good etch selectivity to such materials.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:

receiving a substrate having a tungsten (W) layer formed thereon, wherein a tungsten surface is exposed on a surface of the substrate;

exposing the surface of the substrate to a surface modification solution comprising a halogenation agent dissolved in a non-aqueous solvent, wherein the halogenation agent reacts with the tungsten surface to form a tungsten halide passivation layer, which is self-limiting and insoluble in the surface modification solution;

removing the surface modification solution from the surface of the substrate subsequent to forming the tungsten halide passivation layer;

exposing the surface of the substrate to a dissolution solution to selectively remove the tungsten halide passivation layer, wherein the dissolution solution reacts with the tungsten halide passivation layer to form soluble species, which are dissolved by the dissolution solution to expose an unmodified tungsten surface underlying the tungsten halide passivation layer; and removing the dissolution solution and the soluble species from the surface of the substrate to etch the tungsten layer.

2. The method of claim 1, further comprising repeating said exposing the surface of the substrate to the surface modification solution, removing the surface modification solution, exposing the surface of the substrate to the dissolution solution, and removing the dissolution solution and the soluble species a number of times until a predetermined amount of the tungsten layer is removed from the substrate.

3. The method of claim 1, wherein the halogenation agent is a chlorinating agent, a fluorinating agent or a brominating agent.

4. The method of claim 3, wherein the chlorinating agent is trichloroisocyanuric acid (TCCA), oxalyl chloride, N-chlorosuccinimide, 1-chlorobenzotriazole, Chloramine-T or tert-butyl-N-chlorocyanamide.

5. The method of claim 3, wherein the non-aqueous solvent is an ether, a ketone, a halocarbon, a heterocyclic, an alcohol or another polar organic solvent.

6. The method of claim 1, wherein the surface modification solution is a non-aqueous solution comprising an electrophilic chlorinating agent dissolved in the non-aqueous solvent, wherein the electrophilic chlorinating agent reacts with the tungsten surface to form a tungsten chloride or tungsten oxychloride passivation layer, which is self-limiting and insoluble in the surface modification solution.

7. The method of claim 6, wherein prior to exposing the surface of the substrate to the surface modification solution, the method further comprises selecting a concentration of the electrophilic chlorinating agent in the surface modification solution to avoid substantially increasing a post-etch surface roughness of the tungsten layer compared to an initial surface roughness of the tungsten layer before etching.

8. The method of claim 6, wherein the surface modification solution comprises trichloroisocyanuric acid (TCCA) dissolved in a polar organic solvent, and wherein a concentration of the trichloroisocyanuric acid (TCCA) in the surface modification solution ranges between 0.05% and 0.5%.

9. The method of claim 6, wherein the surface modification solution comprises 0.1% trichloroisocyanuric acid (TCCA) dissolved in ethyl acetate or acetone.

10. The method of claim 6, wherein the dissolution solution is an aqueous solution comprising water, wherein the tungsten chloride or tungsten oxychloride passivation layer is hydrolyzed by the water to form the soluble species, which are dissolved by the dissolution solution to expose the unmodified tungsten surface underlying the tungsten chloride or tungsten oxychloride passivation layer.

11. The method of claim 10, wherein said exposing the surface of the substrate to the dissolution solution comprises:

exposing the surface of the substrate to the dissolution solution at an elevated temperature ranging between 25° C. and 75° C., wherein the elevated temperature increases an etch rate of the tungsten layer by increasing a dissolution rate of the tungsten chloride or tungsten oxychloride passivation layer.

12. The method of claim 6, wherein the dissolution solution is an aqueous solution comprising a base dissolved in water, wherein the tungsten chloride or tungsten oxychloride passivation layer is hydrolyzed by the water to form the soluble species, which are dissolved by the dissolution solution to expose the unmodified tungsten surface underlying the tungsten chloride or tungsten oxychloride passivation layer, and wherein the base increases an etch rate of the tungsten layer by increasing a dissolution rate of the tungsten chloride or tungsten oxychloride passivation layer.

13. The method of claim 12, wherein the base is ammonium hydroxide ($NH_4OH$), tetramethylammonium hydroxide (TMAH), potassium hydroxide (KOH) or calcium hydroxide ($Ca(OH)_2$).

14. The method of claim 12, wherein the dissolution solution further comprises a ligand, which prevents or at least inhibits oxidation of the unmodified tungsten surface after the tungsten chloride or tungsten oxychloride passivation layer is hydrolyzed by the water and removed.

15. The method of claim 14, wherein the ligand is ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid.

16. The method of claim 12, wherein the dissolution solution comprises 0.05 mM to 1 M of ammonium hydroxide ($NH_4OH$) and 0 mM to 10 mM ascorbic acid dissolved in water.

17. A method of etching a substrate using a wet atomic layer etching (ALE) process, the method comprising:

receiving the substrate, the substrate having a tungsten (W) layer formed thereon, wherein a tungsten surface is exposed on a surface of the substrate; and selectively etching the tungsten layer by performing multiple cycles of the wet ALE process, wherein each cycle comprises:

exposing the tungsten surface to a first etch solution comprising an electrophilic chlorinating agent dissolved in a non-aqueous solvent to form a chemically modified W surface layer that is self-limiting and insoluble in the non-aqueous solvent;

rinsing the substrate with a first purge solution to remove the first etch solution from the surface of the substrate;

exposing the chemically modified W surface layer to a second etch solution to selectively dissolve the chemically modified W surface layer and expose an unmodified tungsten surface underlying the chemically modified W surface layer; and rinsing the substrate with a second purge solution to remove the second etch solution from the surface of the substrate and etch the tungsten layer.

18. The method of claim 17, wherein the electrophilic chlorinating agent reacts with the tungsten surface to form a tungsten chloride or tungsten oxychloride passivation layer, which is self-limiting and insoluble in the non-aqueous solvent, and wherein a concentration of the electrophilic chlorination agent in the first etch solution is selected to avoid substantially increasing a post-etch surface roughness of the tungsten layer compared to an initial surface roughness of the tungsten layer before etching.

19. The method of claim 18, wherein the first etch solution comprises trichloroisocyanuric acid (TCCA) dissolved in a polar organic solvent, and wherein a concentration of the trichloroisocyanuric acid (TCCA) in the first etch solution ranges between 0.05% and 0.5%.

20. The method of claim 18, wherein the first etch solution comprises 0.1% trichloroisocyanuric acid (TCCA) dissolved in ethyl acetate or acetone.

21. The method of claim 18, wherein the second etch solution is an aqueous solution comprising a base dissolved in water, wherein the tungsten chloride or tungsten oxychloride passivation layer is selectively dissolved by the water to expose the unmodified tungsten surface underlying the tungsten chloride or tungsten oxychloride passivation layer, and wherein the base increases an etch rate of the tungsten layer by increasing a dissolution rate of the tungsten chloride or tungsten oxychloride passivation layer.

22. The method of claim 21, wherein the second etch solution further comprises a ligand, which prevents or at least inhibits oxidation of the unmodified tungsten surface after the tungsten chloride or tungsten oxychloride passivation layer is selectively dissolved.

23. The method of claim 21, wherein the second etch solution comprises 0.05 mM to 1 M of ammonium hydroxide ($NH_4OH$) and 0 mM to 10 mM ascorbic acid dissolved in water.

* * * * *